(12) United States Patent
Stone

(10) Patent No.: US 10,483,218 B2
(45) Date of Patent: Nov. 19, 2019

(54) INTEGRATED CIRCUIT (IC) DEVICES WITH VARYING DIAMETER VIA LAYER

(71) Applicant: QUALCOMM Incorporated, San Diego, CA (US)

(72) Inventor: William Michael Stone, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/428,441

(22) Filed: May 31, 2019

(65) Prior Publication Data

US 2019/0287929 A1 Sep. 19, 2019

Related U.S. Application Data

(63) Continuation of application No. 15/800,837, filed on Nov. 1, 2017, now Pat. No. 10,347,592.

(Continued)

(51) Int. Cl.
*H01L 23/12* (2006.01)
*H01L 21/4763* (2006.01)
(Continued)

(52) U.S. Cl.
CPC .......... *H01L 23/562* (2013.01); *H01L 21/563* (2013.01); *H01L 21/76802* (2013.01); *H01L 21/76877* (2013.01); *H01L 23/3171* (2013.01); *H01L 23/49816* (2013.01); *H01L 23/5226* (2013.01); *H01L 23/5283* (2013.01); *H01L 24/11* (2013.01); *H01L 24/13* (2013.01); *H01L 24/16* (2013.01); *H01L 25/0657* (2013.01); *H01L 25/50* (2013.01); *H01L 2224/13025* (2013.01); *H01L 2224/13101* (2013.01); *H01L 2224/16145* (2013.01); *H01L 2224/16225* (2013.01); *H01L 2224/16227* (2013.01); *H01L 2225/06513* (2013.01); *H01L 2225/06548* (2013.01); *H01L 2225/06568* (2013.01);
(Continued)

(58) Field of Classification Search
CPC ................. H01L 23/562; H01L 21/563; H01L 21/76802; H01L 21/76877; H01L 23/3171; H01L 23/5226; H01L 23/5283; H01L 23/481
See application file for complete search history.

(56) References Cited

U.S. PATENT DOCUMENTS 6,075,290 A 6/2000 Schaefer et al.
6,518,665 B1 2/2003 Westby et al.
(Continued)

*Primary Examiner* — Alonzo Chambliss
(74) *Attorney, Agent, or Firm* — Loza & Loza, LLP/Qualcomm

(57) ABSTRACT

An integrated circuit (IC) device that includes an IC device layer, at least one electrical connection layer located over the IC device layer, and a varying diameter via layer located over the at least one electrical connection layer. The varying diameter via layer includes (i) an interior region having a plurality of interior region vias and (ii) a perimeter region having a plurality of perimeter region vias. The plurality of interior region vias of the interior region is larger than the plurality of perimeter region vias of the perimeter region. The varying diameter via layer comprises an interior surface that is coupled to an interior surface of the at least one electrical connection layer.

20 Claims, 27 Drawing Sheets

Related U.S. Application Data

(60) Provisional application No. 62/427,319, filed on Nov. 29, 2016.

(51) Int. Cl.
*H01L 23/00* (2006.01)
*H01L 23/498* (2006.01)
*H01L 21/56* (2006.01)
*H01L 23/528* (2006.01)
*H01L 21/768* (2006.01)
*H01L 23/522* (2006.01)
*H01L 23/31* (2006.01)
*H01L 25/00* (2006.01)
*H01L 25/065* (2006.01)

(52) U.S. Cl.
CPC . *H01L 2924/14* (2013.01); *H01L 2924/15311* (2013.01); *H01L 2924/35121* (2013.01)

(56) References Cited

U.S. PATENT DOCUMENTS

| | | |
|---|---|---|
| 7,095,116 B1 | 8/2006 | Kelkar et al. |
| 8,907,496 B1 | 12/2014 | Ning et al. |
| 9,171,769 B2 | 10/2015 | Chow et al. |
| 9,318,404 B2 | 4/2016 | Lin et al. |
| 10,347,592 B2 * | 7/2019 | Stone .................... H01L 23/562 |
| 2006/0099801 A1 | 5/2006 | Cranmer et al. |
| 2012/0126400 A1 | 5/2012 | Lee |
| 2013/0037944 A1 | 2/2013 | Lee et al. |
| 2013/0105988 A1 | 5/2013 | Lee et al. |
| 2018/0151513 A1 | 5/2018 | Stone |

* cited by examiner

INTEGRATED CIRCUIT (IC) DEVICES WITH VARYING DIAMETER VIA LAYER

CROSS-REFERENCE TO RELATED APPLICATION(S)

This application is a continuation application of U.S. patent application Ser. No. 15/800,837, filed in the U.S. Patent and Trademark Office on Nov. 1, 2017. U.S. patent application Ser. No. 15/800,837 claims priority to U.S. Provisional Application No. 62/427,319, filed Nov. 29, 2016, for "INTEGRATED CIRCUIT (IC) FLIP CHIP DIES WITH VARYING DIAMETER PASSIVATION VIAS." The entire contents of both applications are incorporated herein by reference as if fully set forth below in their entirety and for all applicable purpose.

FIELD OF THE DISCLOSURE

Various features relate generally to integrated circuit (IC) devices, and more particularly to techniques for reducing damage due to certain stresses within flip chip dies or packages that employ passivation layers.

BACKGROUND

Flip chip technology is an alternative to wire bonding. Flip chip technology enables direct electrical connections between the electronic components of a chip and the corresponding supporting substrate. The electronic components are often mounted or coupled face down (i.e., "flipped") on the semiconductor chips and connected, both electrically and physically, to the substrate by conductive bumps. Flip chips may be advantageous because the chip is directly attached (electrically and physically) to the semiconductor substrate, board, or carrier by the solder bumps.

Flip chips may be fabricated by a process that includes placing solder bumps on a semiconductor substrate. The solder bumps of the flip chip assembly provide an electrically conductive path from the chip to a semiconductor substrate on which the chip is mounted or coupled. The bumps also generally provide for the mechanical mounting or coupling of the chip to the semiconductor substrate. Some flip chip dies are provided with passivation layers to provide electrical stability by isolating transistor surfaces from the environment. Generally, a passivation layer may provide physical, chemical or electrical insulation/isolation, stability or separation between IC layers or components. A passivation layer may also facilitate the formation of thin film transistors or other components by, e.g., reducing electrical or chemical effects that might otherwise arise in adjacent components. In this regard, current leakage, parasitic capacitance or oxidation effects can be reduced or eliminated with a suitable passivation layer. Vias may be provided within the passivation layer to allow for electrical interconnects through the passivation layer to the aforementioned solder bumps.

However, with flip chip technology, issues can arise involving delamination of the passivation layer or adjacent layers during package assembly or subsequent use due to stress or strain. For example, advanced fabrication modes form passivation layers that may be sensitive to delamination under flip chip bumps during assembly.

SUMMARY

Various features relate to an integrated circuit (IC) device.

In one example, an integrated circuit (IC) device that includes an IC device layer, at least one electrical connection layer located over the IC device layer, and a varying diameter via layer located over the at least one electrical connection layer. The varying diameter via layer includes (i) an interior region having a plurality of interior region vias and (ii) a perimeter region having a plurality of perimeter region vias. The plurality of interior region vias of the interior region is larger than the plurality of perimeter region vias of the perimeter region. The varying diameter via layer comprises an interior surface that is coupled to an interior surface of the at least one electrical connection layer.

In another example, a method for fabricating an integrated circuit (IC) device includes providing an IC device layer; forming at least one electrical connection layer over the IC device layer; and forming a varying diameter via layer over the at least one electrical connection layer, the varying diameter via layer comprising (i) an interior region having a plurality of interior region vias and (ii) a perimeter region having a plurality of perimeter region vias. The plurality of interior region vias of the interior region is larger than the plurality of perimeter region vias of the perimeter region. The varying diameter via layer comprises an interior surface that is coupled to an interior surface of the at least one electrical connection layer.

In yet another example, an apparatus for facilitating electrical device interconnections within an IC device includes: means for facilitating electrical device interconnections to an IC device layer through an interior region of a second layer; and means for facilitating electrical device interconnections to the IC device layer through a perimeter region of the second layer; wherein the means for facilitating electrical device interconnections through the interior region includes vias that are larger than vias within the means for facilitating electrical device interconnections through the perimeter region of the second layer.

In still yet another example, a machine-readable storage medium for controlling fabrication of an IC device is provided, the machine-readable storage medium having one or more instructions which when executed by at least one processing circuit causes the at least one processing circuit to: control a fabrication machine to form a varying diameter via layer on an IC device layer, wherein the varying diameter via layer has an interior region and a perimeter region; control the fabrication machine to form interior region vias within the interior region; and control the fabrication machine to form perimeter region vias within the perimeter region; wherein the interior region vias are formed larger than the perimeter region vias.

DRAWINGS

Various features, nature and advantages may become apparent from the detailed description set forth below when taken in conjunction with the drawings in which like reference characters identify correspondingly throughout.

Figure 10:
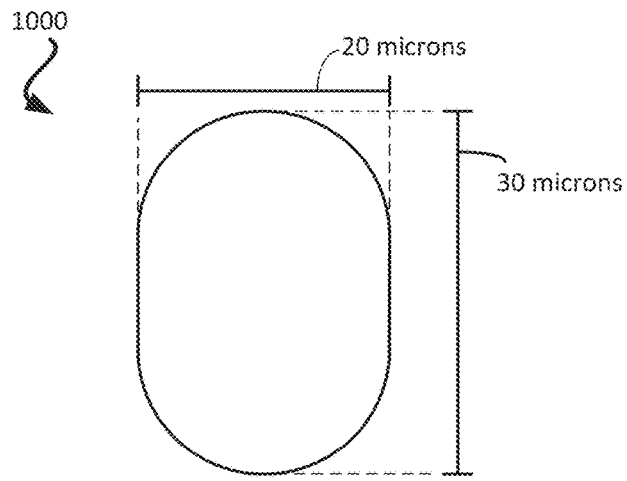
Figure 10:
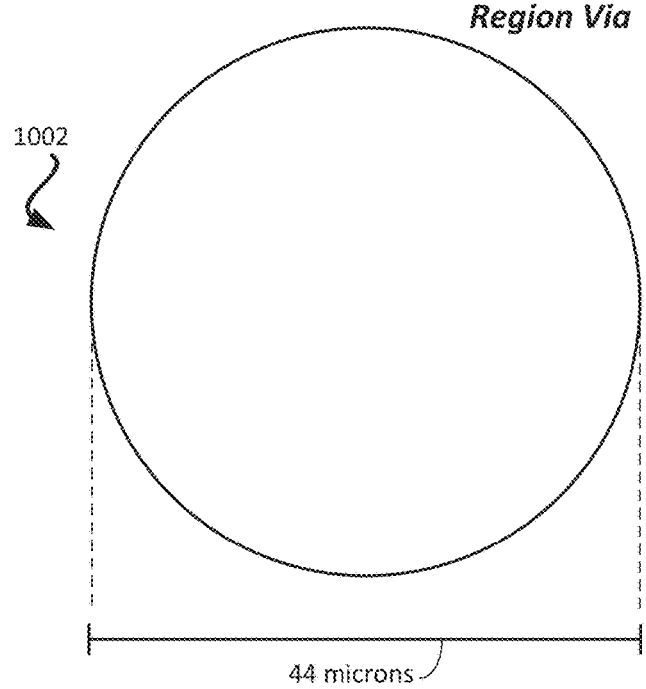

FIG. 10 provides planar views exemplary core and perimeter region vias, along with exemplary dimensions.

Figure 11:
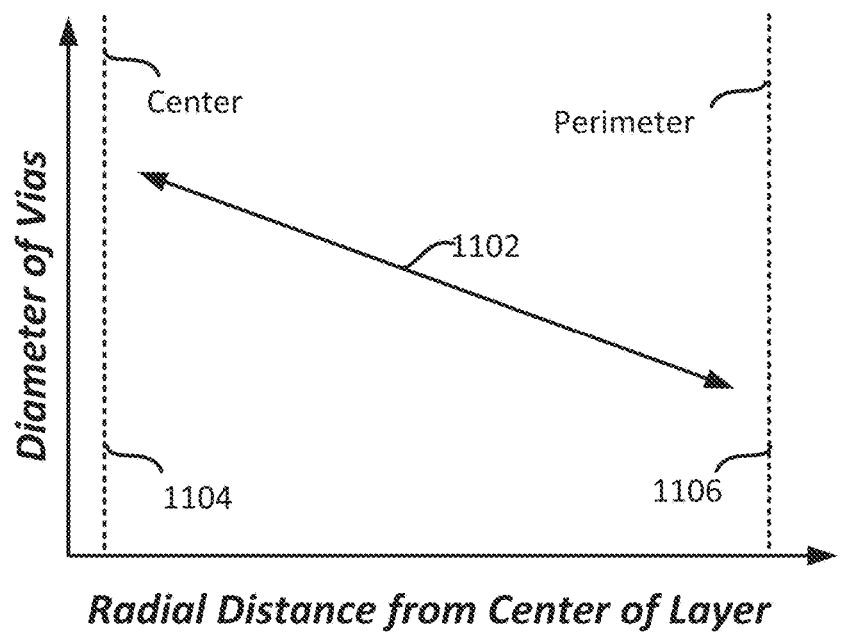

FIG. 11 is a graph illustrating a uniform linear decrease in via size (e.g. diameter) from a center of a passivation layer toward its perimeter.

Figure 12:
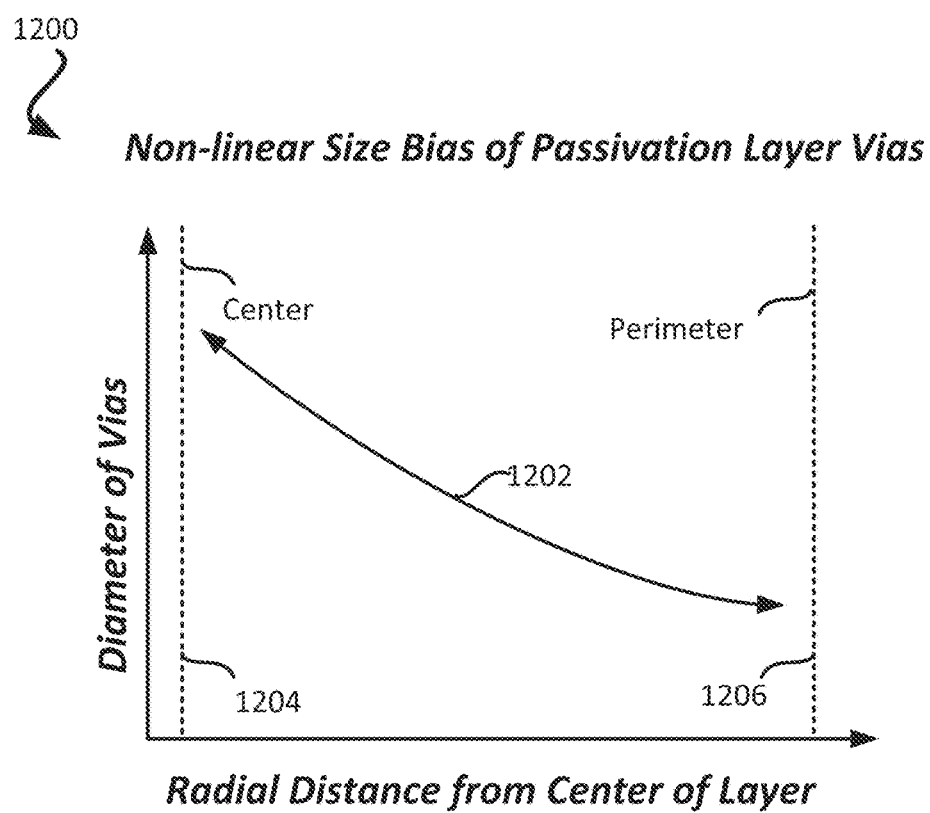

FIG. 12 is a graph illustrating a non-linear decrease in via size (e.g. diameter) from a center of a passivation layer toward its perimeter.

Figure 13:
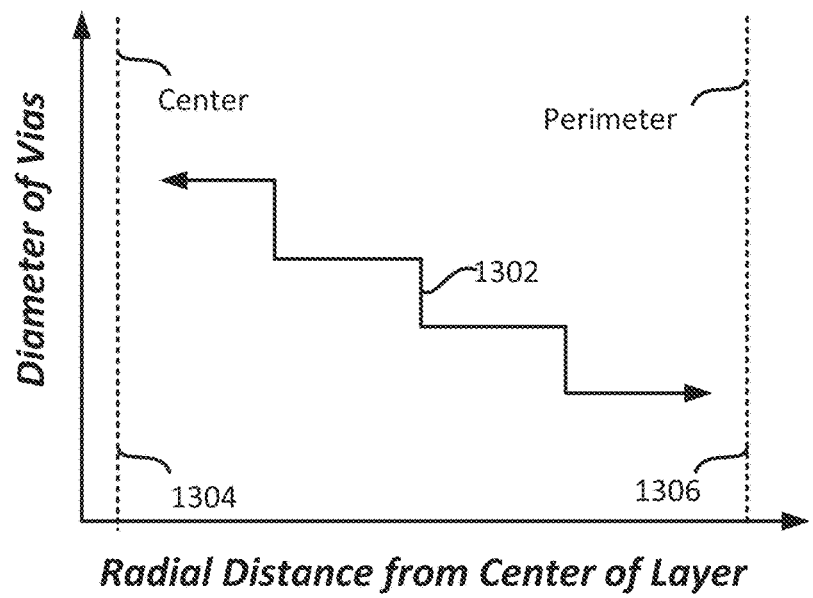

FIG. 13 is a graph illustrating a step-wise increase in via size (e.g. diameter) from a perimeter of a passivation layer toward its center.

Figure 14:
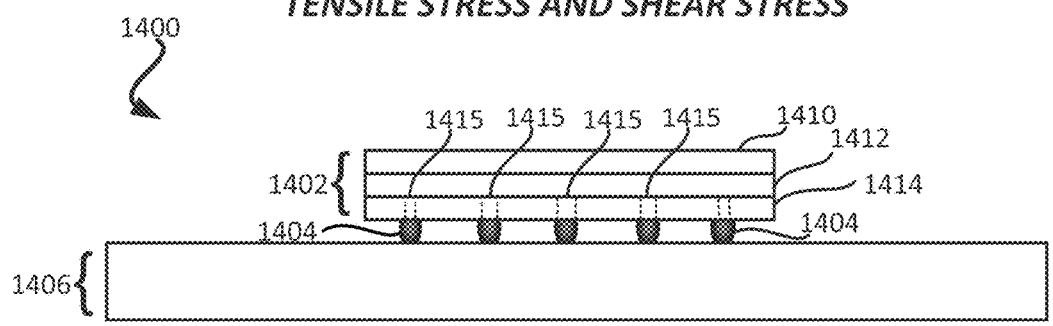

FIG. 14 is an elevational view of a portion of an exemplary flip chip package having a passivation layer in an upper structure or layer and particularly illustrating the relative sizes of vias (shown in phantom lines) formed within the passivation layer.

Figure 15:
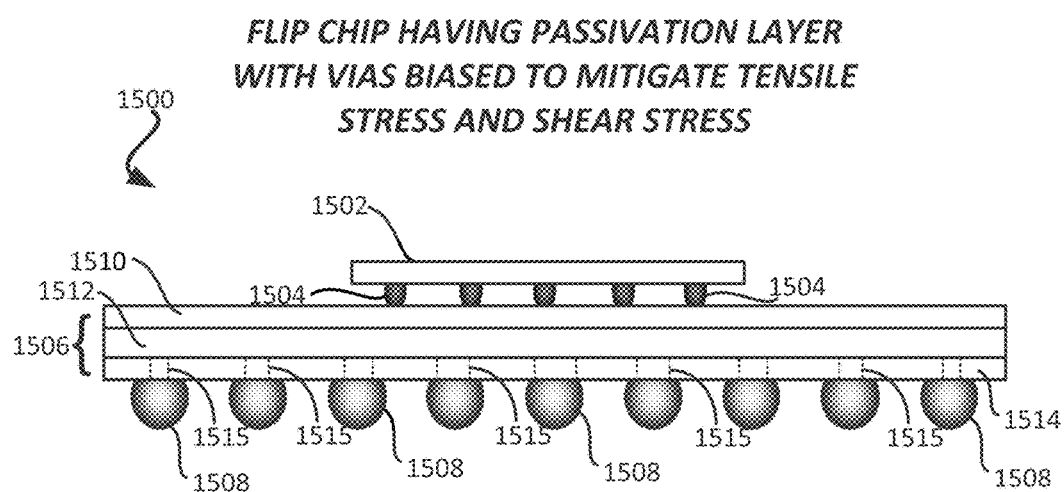

FIG. 15 is an elevational view of a portion of another exemplary flip chip package having a layer with varying diameter vias in a lower structure.

Figure 16:
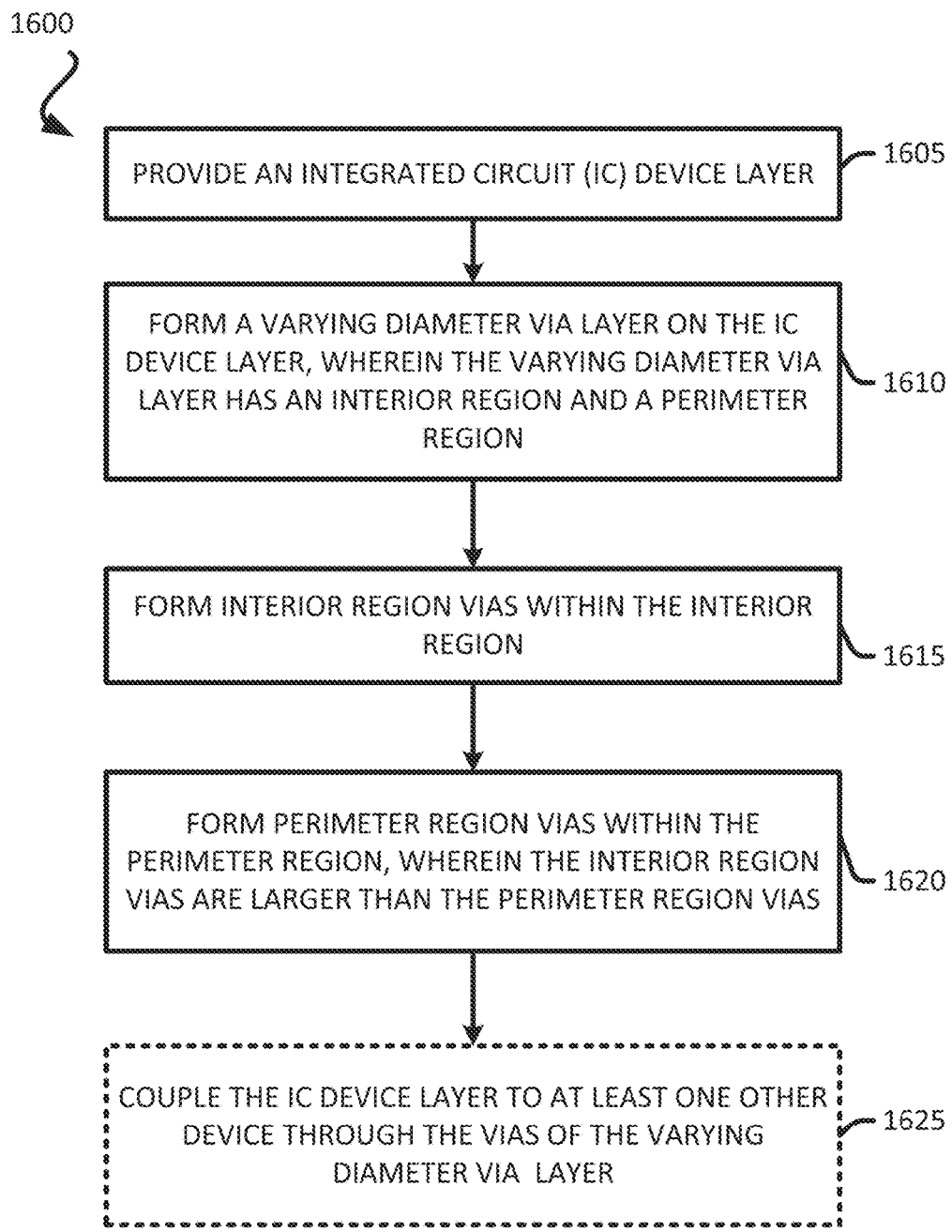

FIG. 16 illustrates a flow diagram of an exemplary method for fabricating an integrated circuit (IC) device that includes at least one passivation layer via configured to reduce a risk of damage due to tensile stress.

Figure 17:
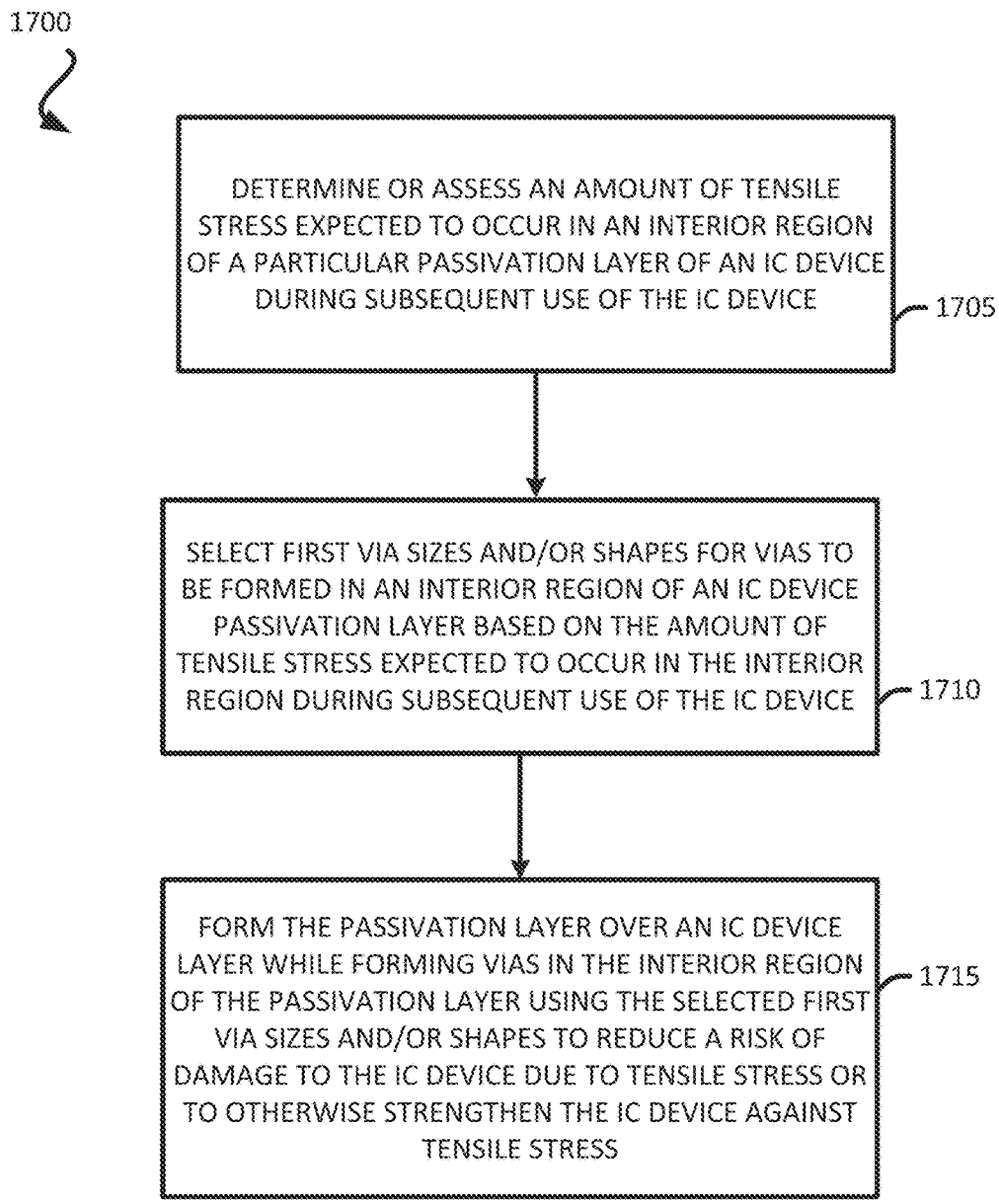

FIG. 17 illustrates further features of an exemplary method for fabricating an IC device to reduce a risk of damage due to tensile stress.

Figure 18:
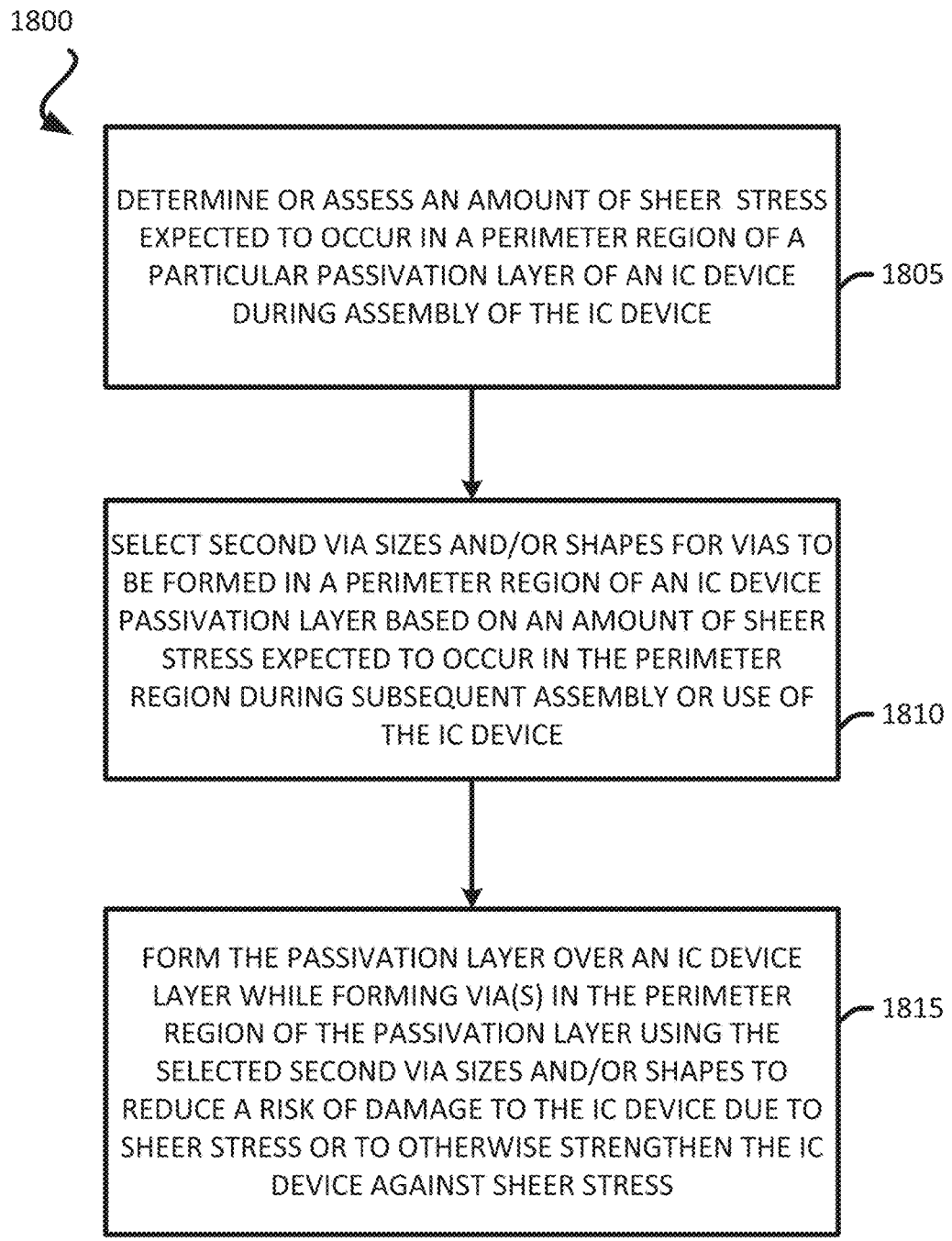

FIG. 18 illustrates a flow diagram of an exemplary method for fabricating an IC device that additionally includes at least one passivation layer via configured to reduce a risk of damage due to sheer stress.

Figure 19:
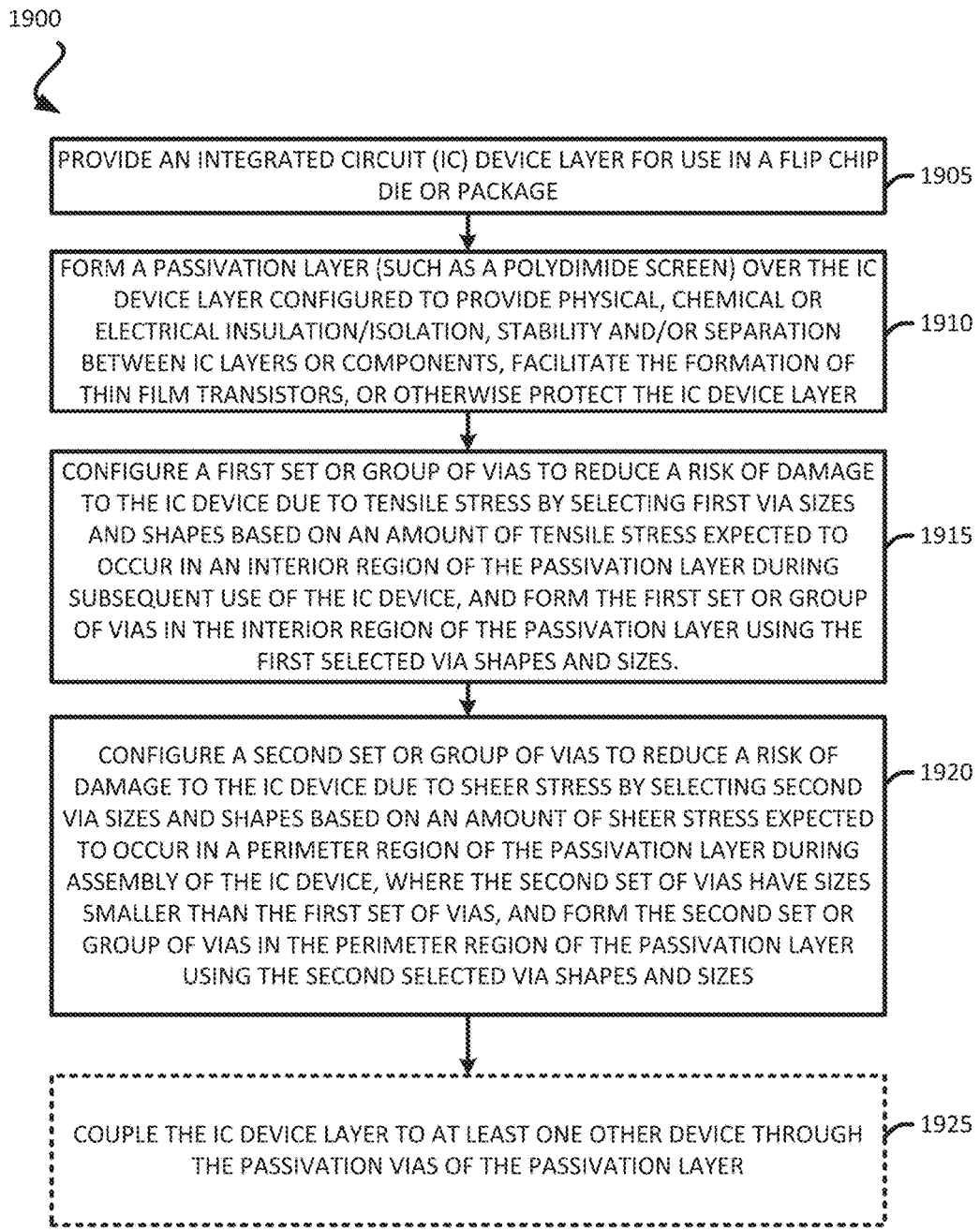

FIG. 19 illustrates a flow diagram of an exemplary method for fabricating an IC device that includes a first group of passivation layer vias formed near a perimeter of the passivation layer with a first size and a second group of passivation layer vias formed in an interior of the passivation layer with a second, different size.

Figure 20:
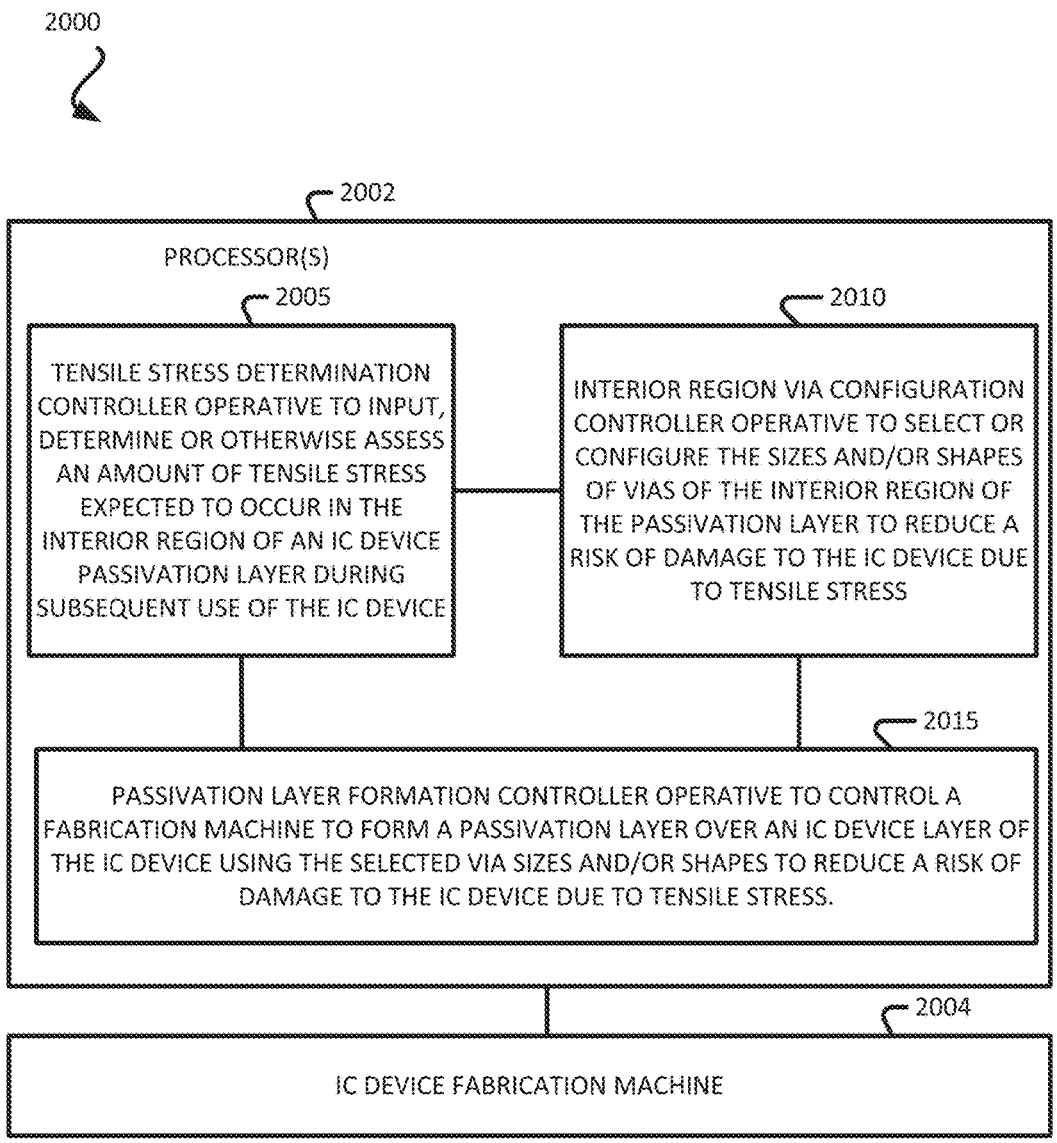

FIG. 20 is a block diagram of an exemplary system having processor components for controlling the fabrication of an IC device that includes at least one passivation layer via configured to reduce a risk of damage due to tensile stress.

Figure 21:
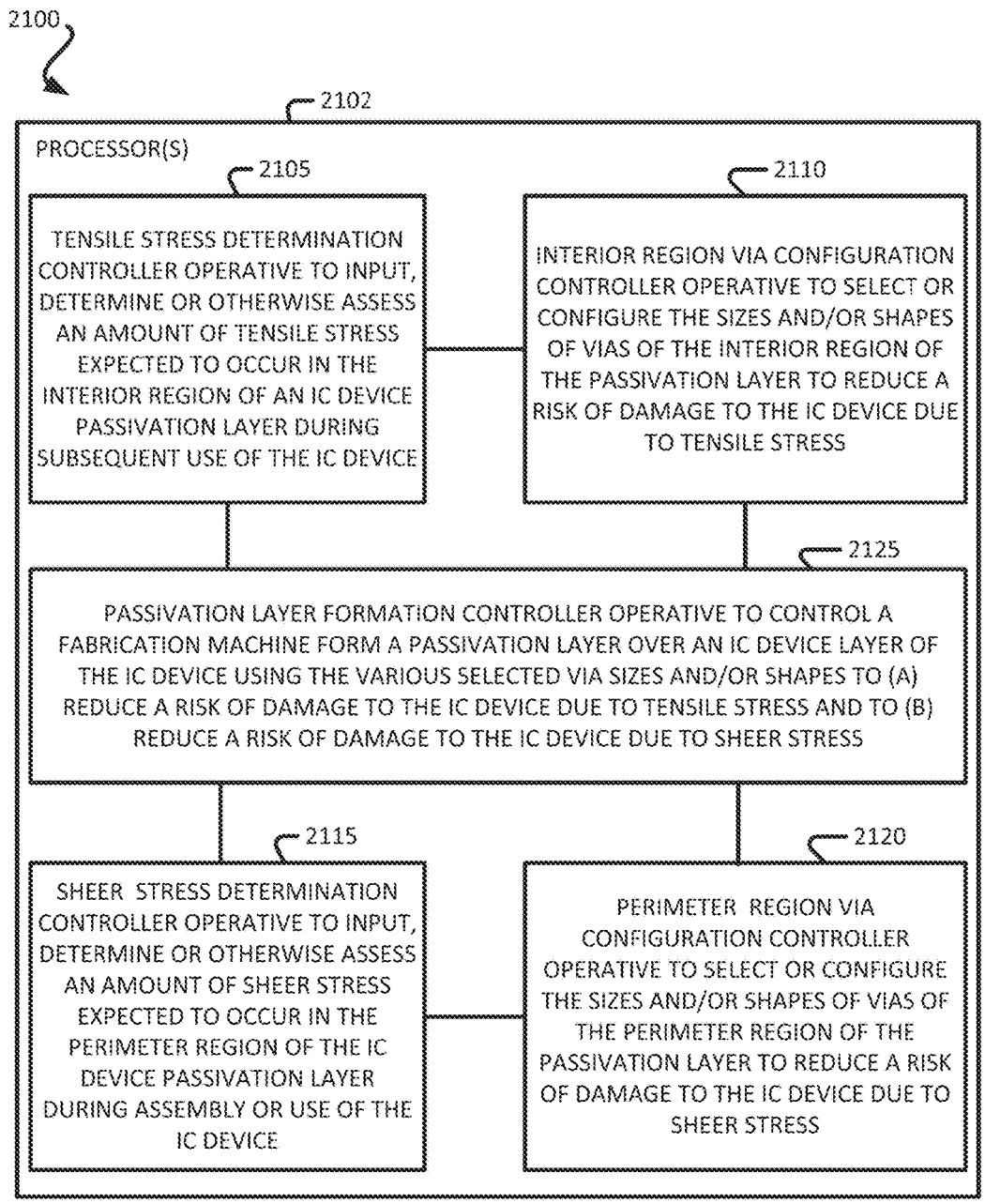

FIG. 21 is a block diagram of an exemplary system having additional processor components for controlling the fabrication of an IC device that also includes vias configured to reduce a risk of damage due to sheer stress.

Figure 22:
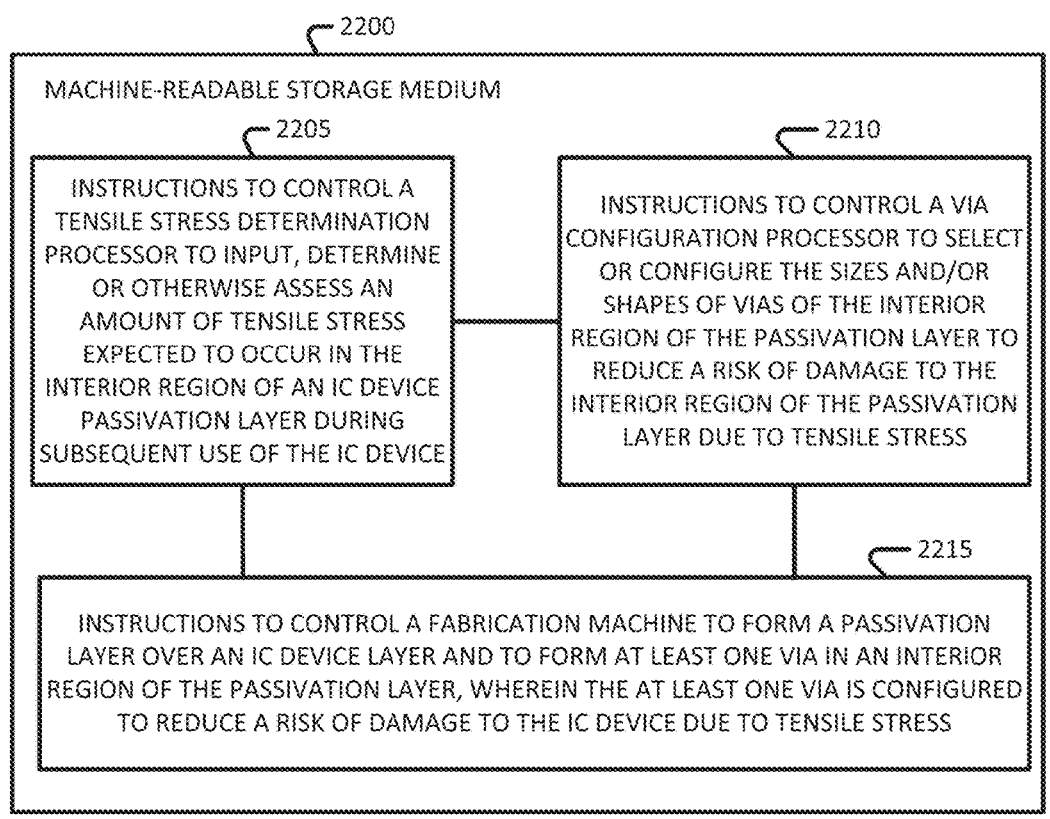

FIG. 22 is a block diagram of an exemplary machine-readable medium having instructions for controlling the fabrication of an IC device that includes at least one passivation layer via configured to reduce a risk of damage due to tensile stress.

Figure 23:
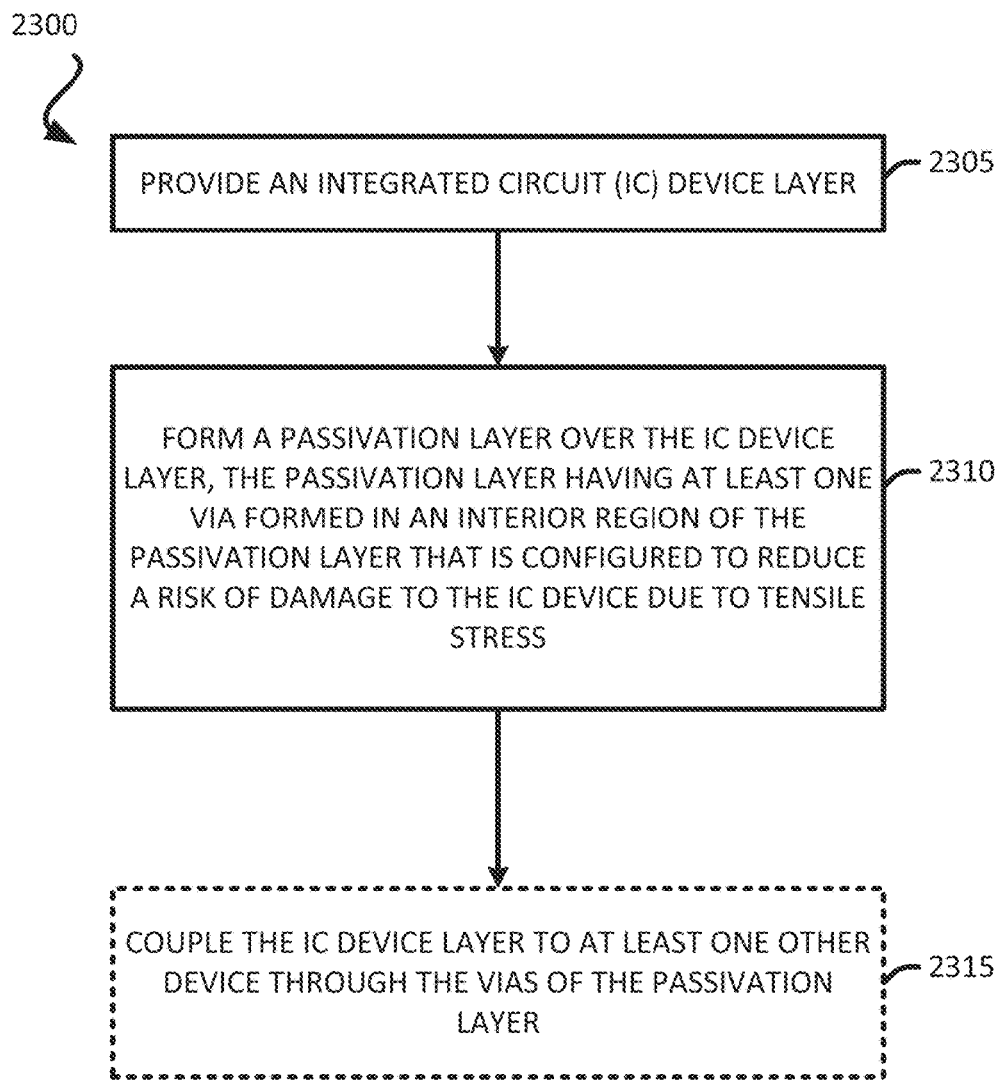

FIG. 23 illustrates a flow diagram of another exemplary method for fabricating an IC device that includes at least one passivation layer via configured to reduce a risk of damage due to tensile stress.

Figure 24:
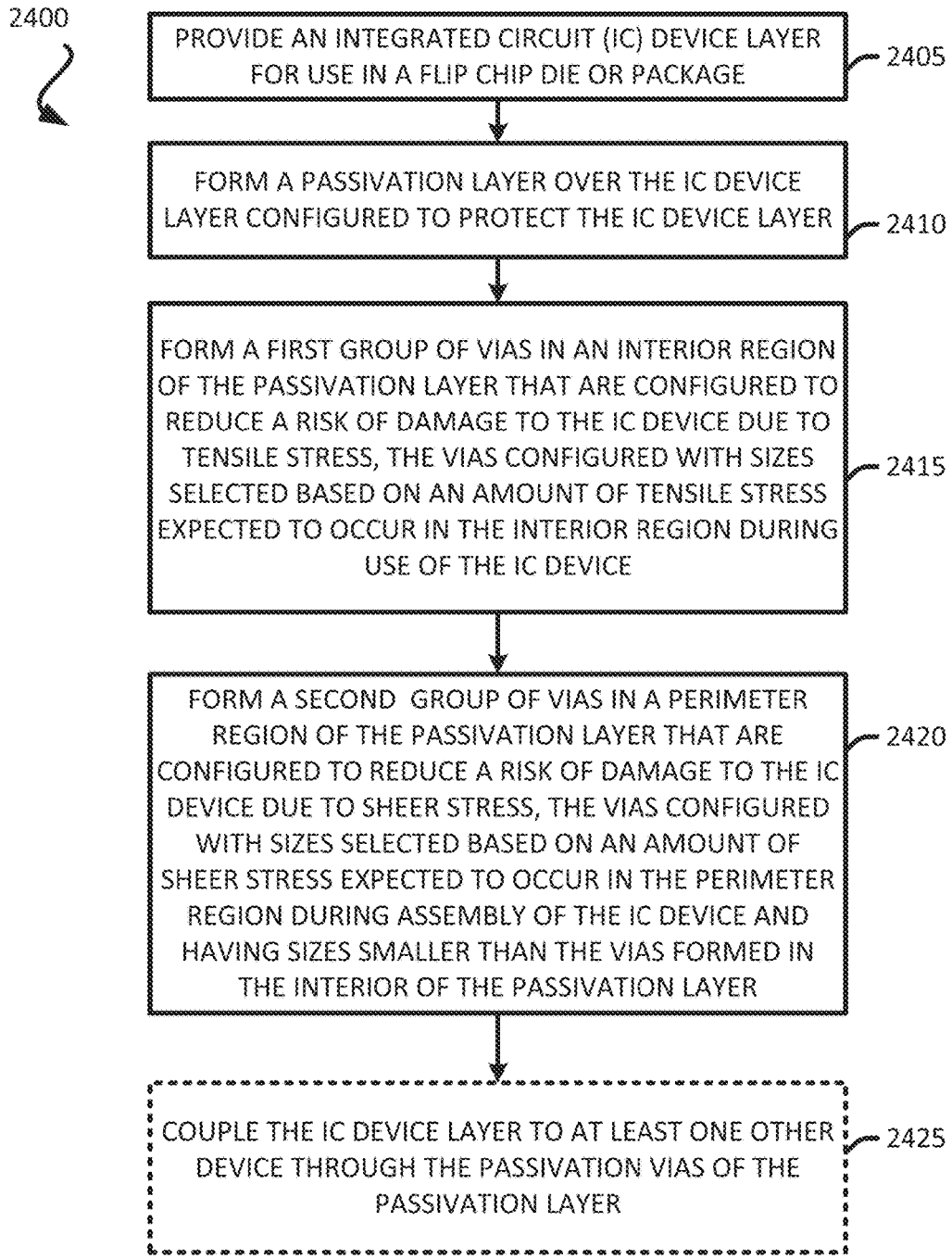

FIG. 24 illustrates a flow diagram of another an exemplary method for fabricating an IC device that additionally includes at least one passivation layer via configured to reduce a risk of damage due to sheer stress.

Figure 25:
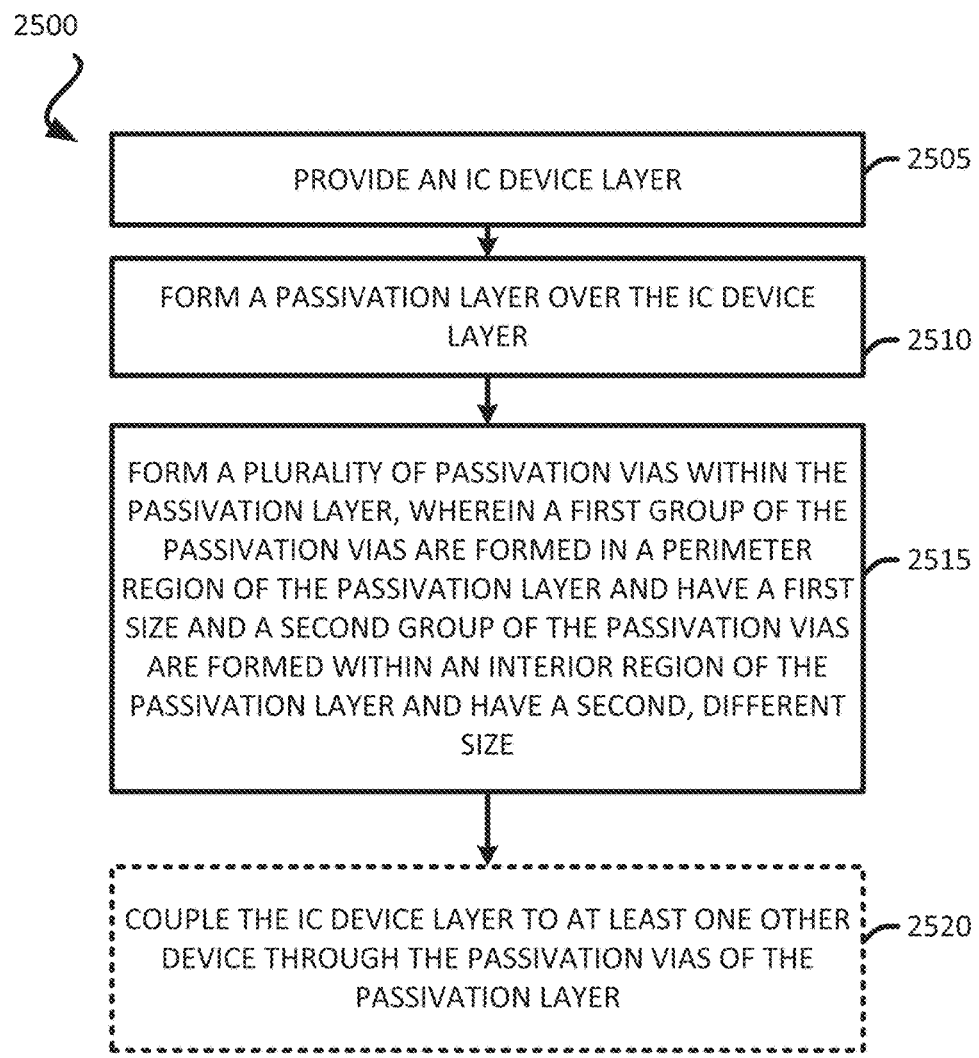

FIG. 25 illustrates a flow diagram of an exemplary method for fabricating an IC device that includes a first group of passivation layer vias formed near a perimeter of the passivation layer with a first size and a second group of passivation layer vias formed in an interior of the passivation layer with a second, different size.

Figure 26:
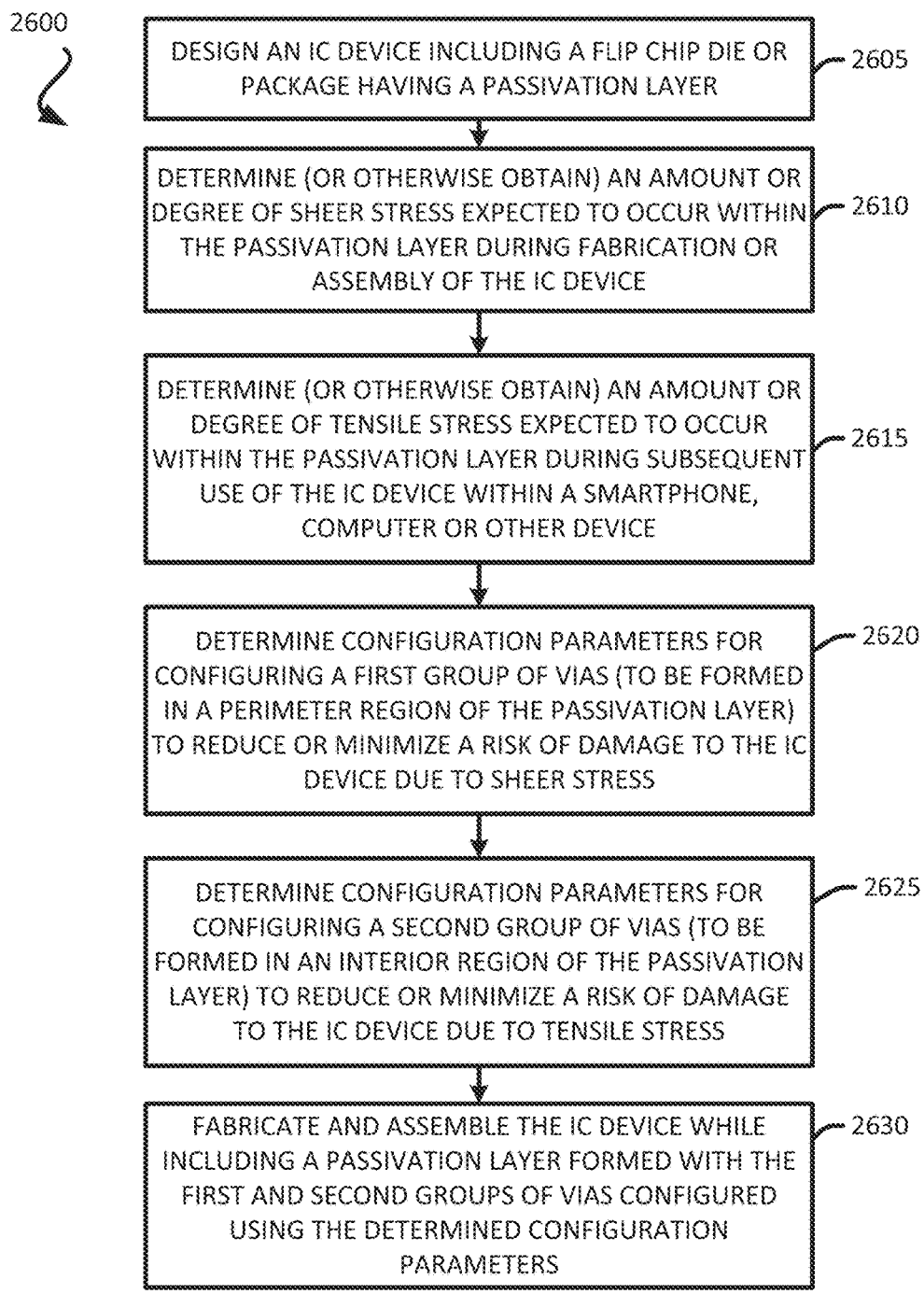

FIG. 26 illustrates a flow diagram of an exemplary method for designing, fabricating and assembling an IC device that includes a first group of passivation layer vias configured to mitigate sheer stress and a second group of passivation layer vias configured to mitigate tensile stress.

Figure 27:
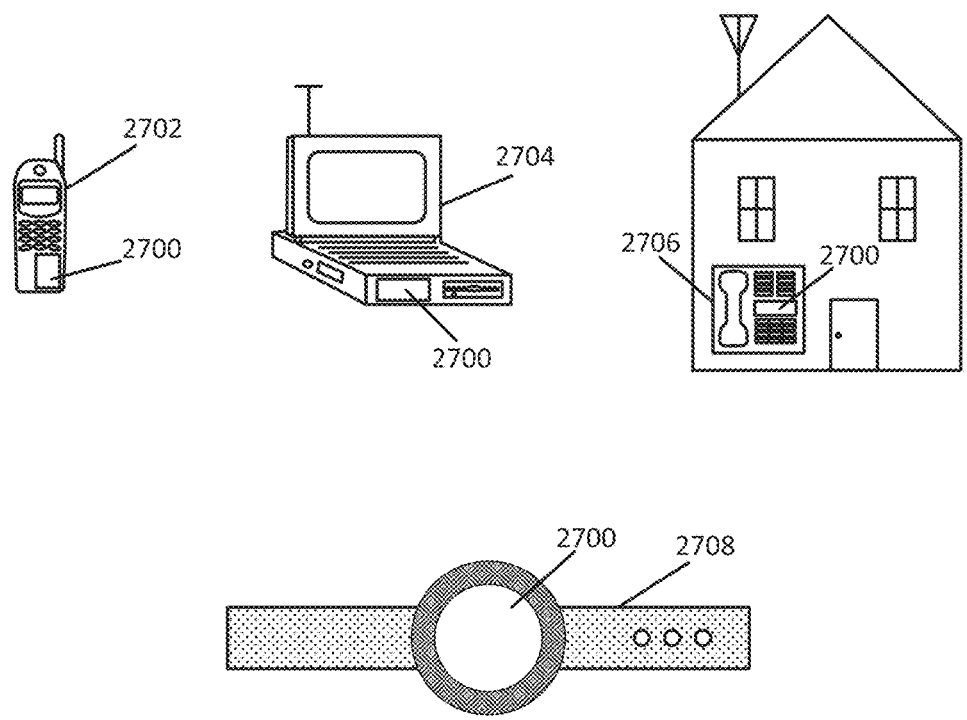

FIG. 27 illustrates various electronic devices that may include the various integrated devices, integrated device packages, semiconductor devices, dies, integrated circuits, and/or packages described herein.

DETAILED DESCRIPTION

Figure 1:
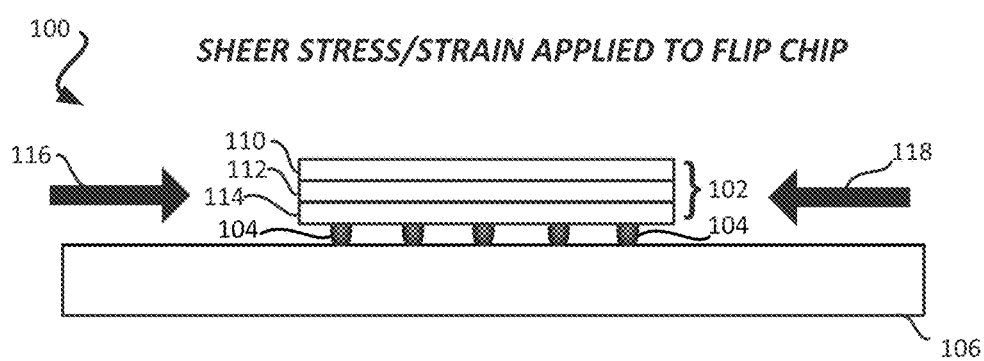
FIG. 1 is an elevational view of a portion of an exemplary flip chip package having a passivation layer and particularly illustrating sheer stresses and/or strains that tend to delaminate the passivation layer during assembly or use.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.
Exemplary Passivation Layers Configured to Reduce Shear Stress Failure Modes FIG. 1 illustrates a portion of a flip chip package 100 having various components or device layers connected or coupled via bumps and particularly illustrating shear stress forces that may arise during assembly or use. Briefly, an integrated circuit (IC) device 102 is coupled using bumps 104 to a substrate or other component 106. In the example of FIG. 1, IC device 102 has three layers 110, 112 and 114. Layer 114 is a passivation layer. Vias (not shown in FIG. 1) within the passivation layer 114 allow for (or otherwise facilitate) electrical interconnection of circuit components within layer 112 to another device or package using the bumps 104. During assembly of a package incorporating the components of FIG. 1 (or during subsequent use), sheer stress may arise within the various components, including passivation layer 114, along the direction shown by arrows 116 and 118, resulting in possible delamination (shown in FIG. 2) due to any resulting strain caused by the stress.

Herein, the stress applied to a material may be generally regarded as the force per unit area applied to the material. Sheer stress is the component of stress coplanar with a material cross section and hence may arise from a force vector component parallel to the cross section (as in the example of FIG. 1). Tensile stress is the stress caused by an applied load that tends to elongate a material along the axis of the applied load (as in the example of FIG. 4, discussed below), e.g. a form of stress caused by pulling the material, which may result in the material being pulled apart. Strain refers to the deformation of a material due to stress. The particular deformation may depend on the type and direction of the stress.

Figure 2:
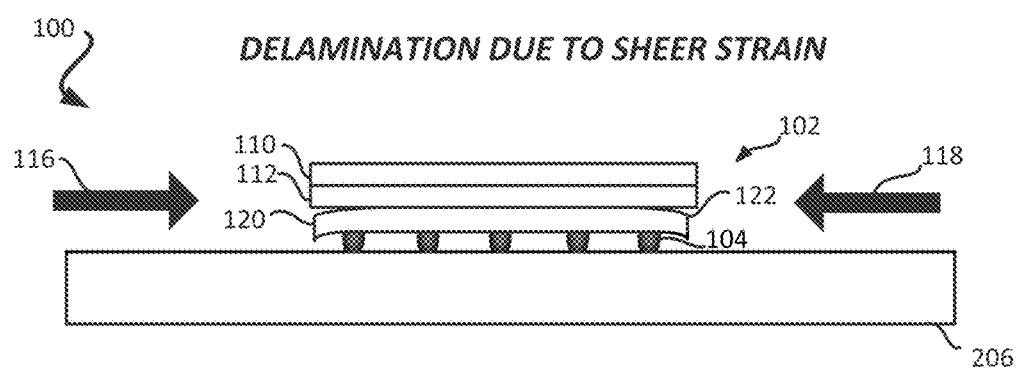
FIG. 2 is an elevational view of a portion of an exemplary flip chip package having a passivation layer and particularly illustrating delamination of perimeter portions of the passivation layer caused by sheer stress during device assembly or use.

FIG. 2 illustrates exemplary delamination within the flip chip package 100 caused by sheer stress forces 116 and 118, i.e. by the strain resulting from the sheer forces. Briefly, in the example of FIG. 2, perimeter portions 120 and 122 of the passivation layer 114 delaminate in the vicinity of the perimeter bumps of the set of bumps 104. As this failure can occur during fabrication or assembly, the resulting die or package is discarded, resulting in lower yield. If it occurs during subsequent use of a device in which the flip chip is used, the device may no longer be operational and would need to be fixed or replaced, at perhaps considerable cost. Note also that in the example of FIG. 2, it is the passivation layer that delaminates due to the sheer stress, but delamination can also damage other layers or components.

Figure 3:
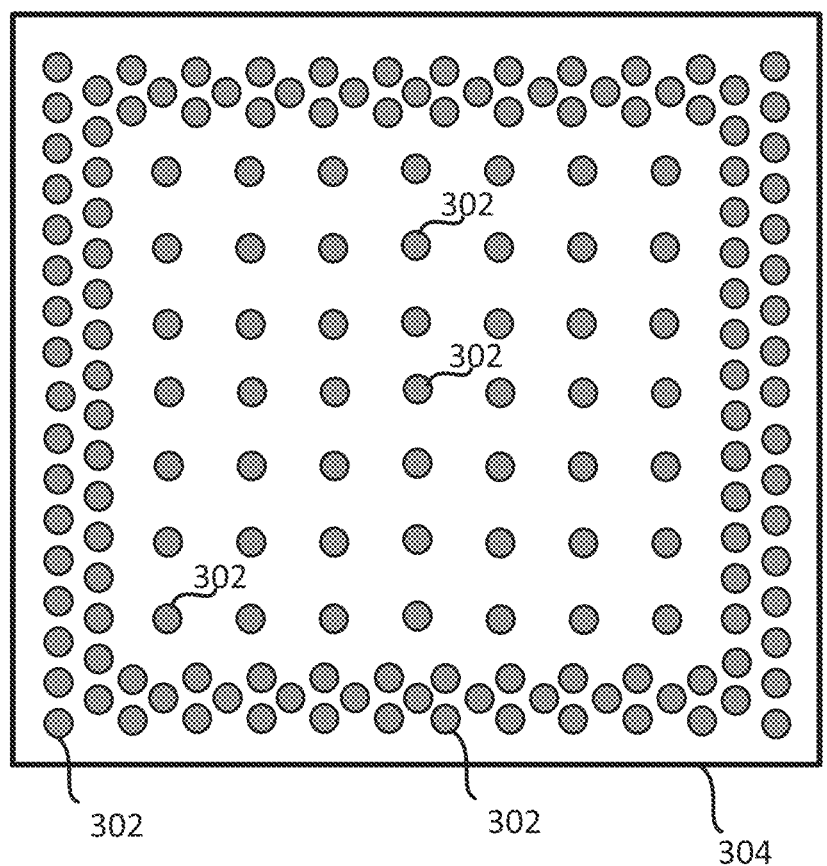
FIG. 3 is a planar view of a passivation layer for a flip chip die, particularly illustrating relatively small via sizes that are biased so as to mitigate sheer stresses and/or strains that tend to delaminate the passivation layer during assembly.

FIG. 3 illustrates a partial solution to the delamination problem, whereby the vias 302 of a passivation layer 304 of a flip chip die or package are set to relatively small sizes to mitigate the risk of damage due to the aforementioned sheer stress or strain. That is, the sheer stress/strain failure mode may be mitigated by biasing the sizes of the passivation layer vias to relatively small sizes. Smaller vias allow for better passivation between the bump and die to buffer the shear stress and reduce the risk of delamination. However, more recently, a tensile failure mode has been identified that conflicts with the shear mode need for small passivation vias. The tensile failure mode appears to occur primarily during field use of the flip chip package, i.e. during transport or usage of a smartphone or other device in which the flip chip IC is installed and used.

Figure 4:
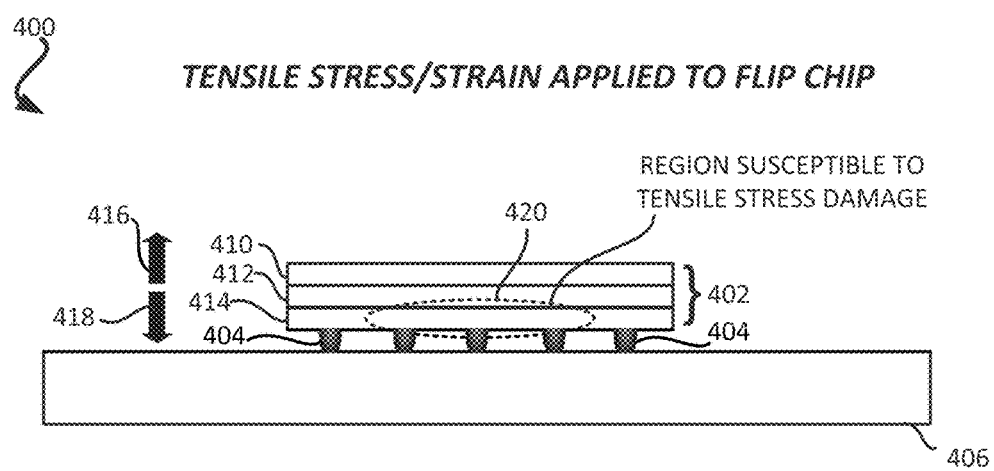
FIG. 4 is an elevational view of a portion of an exemplary flip chip package having a passivation layer and particularly illustrating tensile stresses that tend to damage the center or core of the passivation layer during transport or use of a device in which the flip chip is installed.

FIG. 4 illustrates tensile stress that can occur during device usage. Briefly, an IC device 402 of a flip chip package 400 is again coupled using a bumps 404 to a substrate 406. The IC device 402 has three layers 410, 412 and 414, the lowermost of which is passivation layer 414. Vias (not shown in FIG. 4) within the passivation layer 414 again allow for electrical interconnection of circuit components within layer 412 to another device or package using bumps 404. During subsequent transport or use of a smartphone or other device incorporating the components of FIG. 4, tensile stress may arise along the direction shown by arrows 416 and 418, resulting in possible damage to a center portion 420 of the passivation layer or adjacent layers due to any tensile strain caused by the tensile stress. The tensile failure mode arises, at least in part, due to encapsulation of IC device components within an encapsulant (not shown in the figures) that may expand or contract due to heat and hence may impart tensile forces or stresses to the components.

Forming the passivation layer vias with relatively small sizes as in FIG. 3 to mitigate the sheer failure mode of FIG. 2 appears to exacerbate the tensile failure mode of FIG. 4. Accordingly, it would be advantageous to address the tensile stress failure mode of FIG. 4 while still mitigating the sheer stress failure mode of FIG. 2.

Exemplary Passivation Layers with Varying Diameter Vias

Some features pertain to an IC device having an IC device layer and a passivation layer formed over the IC device layer, wherein the passivation layer has vias of different sizes, i.e., the passivation layer is a varying diameter via layer. In some examples, the passivation layer has an interior or core region with vias (herein "interior region vias") that are larger than vias formed in a perimeter region (herein "perimeter region vias"). At least one of the vias formed in the interior region of the passivation layer is configured to reduce a risk of damage to the IC device due to tensile stress.

In some implementations, at least one via formed in the interior region has a size selected based on an amount of tensile stress, such as the amount of tensile stress expected to occur in the interior region during use of the IC device (as determined, e.g., using computer modelling). In some implementations, the passivation layer has at least one via configured to reduce a risk of damage to the IC device due to sheer stress. In some implementations, vias formed in the perimeter region have sizes selected based on an amount of shear stress expected to occur in the perimeter region during assembly or use of the IC device (as determined, e.g., using computer modelling). In some implementations, at least one via in the interior region has a width that is larger than the width of at least one via formed in the perimeter region.

In some implementations, a plurality of vias is formed in the interior region with vias having sizes that differ from one another. For example, the vias in the interior region may have widths that increase toward a center of the passivation layer. In some examples, the vias have sizes that increase uniformly toward the center of the passivation layer. In some examples, the vias have sizes that increase by step-wise increments toward the center of the passivation layer. Although described primarily with respect to passivation layers, the varying diameter via layer techniques described herein are not necessarily limited to passivation layers. That is, other layers may be provided within an IC device that has interior region vias that are larger than perimeter region vias.

In some implementations, the IC device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Figure 5:
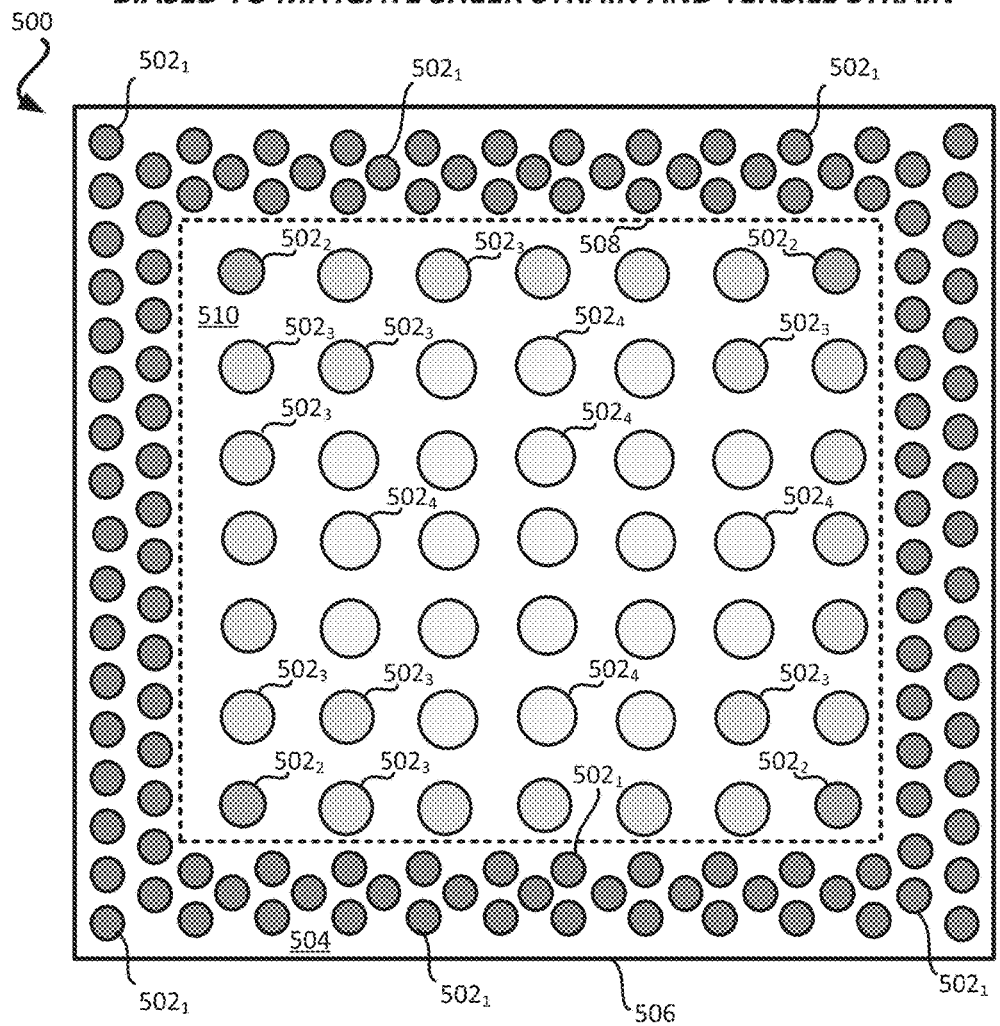
FIG. 5 is a planar view of an exemplary passivation layer for a flip chip die, wherein vias near a perimeter of the die have relatively small sizes to mitigate sheer stresses and/or strains during assembly and where vias closer to the center of the die have relatively larger sizes to mitigate tensile stress during subsequent device use.

FIG. 5 illustrates an exemplary passivation layer 500 that is configured as a varying diameter via layer for use in a flip-chip die or package having. Various sets of vias 502 are shown, wherein interior region vias formed in an interior region of the passivation layer are configured to reduce a risk of damage to the IC device due to tensile stress and/or strain and perimeter region vias formed in a perimeter region of the passivation layer are configured to reduce a risk of damage to the IC device due to shear stress and/or strain. In the example of FIG. 5, a first set of vias $502_1$ is formed in a perimeter region 504 of the passivation layer 500, where the perimeter region 504 is the portion of the passivation layer 500 between an outer perimeter 506 and the dashed line 508 of the figure. Various sets of interior region vias $502_2$, $502_3$, and $502_4$ are formed in an interior region 510 of the passivation layer 500, where the interior region 510 is the portion of the passivation layer 500 inside the dashed line 508 of the figure. In this example, each of the interior region vias $502_2$, $502_3$ and $502_4$ of the interior region are larger than the perimeter region vias $502_1$ with via diameters or widths increasing toward the center of the passivation layer 500. Thus, vias of variable or varying size or other dimensions are provided.

Generally speaking, the greatest tensile stress is expected to occur at the center (or core) of the passivation layer and so vias are biased to larger sizes (widths) toward the center, as larger via size (width) is expected to more effectively distribute tensile stress. Vias of differing sizes (widths) are provided to blend or scale the sizes of the vias from the perimeter toward the core of the passivation layer 500 to achieve a balance between sheer stresses that tend to affect the perimeter regions and tensile stresses that tend to affect the core regions. In FIG. 5, the vias 502 are shaded to more clearly show the differently-sized groups of vias, with the smallest vias shaded a darker gray and the larger vias shaded more lightly.

In some implementations, one or more of the vias $502_1$ within the perimeter region 504 are sized, biased or otherwise configured to reduce or mitigate a risk of damage to the passivation layer 500 or adjacent layers due to sheer stress, particularly to reduce a risk of delamination that might otherwise occur during assembly of a flip chip die or package that includes the passivation layer. For example, at least one via formed in the perimeter region 504 has a size selected based on an amount of shear stress expected to occur in the perimeter region 504 during assembly or use of an IC device incorporating the passivation layer, such as a package on package (PoP) device. The amount of shear stress expected to occur in the perimeter region during assembly or use of the IC device may be assessed using computer modelling, or by physically testing similar IC devices in a laboratory, or by using other known techniques and may vary depending upon the characteristics of the passivation layer (e.g. its thickness and material constituents), the characteristics of adjacent layers, bumps, and interconnects, and the assembly methods and components used.

In one illustrative example, the vias $502_1$ within the perimeter region 504 have diameters (widths) in the range of 15 to 30 microns (or, e.g., more specifically 20-25 microns or, e.g., even more specifically 19-20 microns), which is smaller than the sizes (widths) of vias that might be used in a flip chip passivation layer if sheer stress were not a concern (e.g. somewhat larger diameters in the range of 30 to 60 microns or, e.g., more specifically 35-55 microns or, e.g., even more specifically 30-45 microns). In a particular flip chip implementation, the sizes of the vias within the perimeter region 504 may be optimized based on computer modelling to minimize the risk of sheer stress or strain damage or, at least, sizes for the vias may be determined to reduce the risk of sheer stress failure. It is noted that numerous other design considerations and constraints may also be addressed in the design of a flip chip device and so the via size that is optimal for mitigating sheer stress to avoid delamination may not be the overall optimal size when taking all factors into consideration.

In some implementations, one or more of the vias $502_2$, $502_3$, and $502_4$ formed in the interior region 510 are sized, biased or otherwise configured to reduce or mitigate a risk of damage to the passivation layer 500 or adjacent layers due to tensile stress, particularly to reduce a risk of damage that might otherwise occur during field use of a smartphone or other device that includes a flip chip die or package with the passivation layer 500 (due, e.g. to heat stress). For example, at least one via formed in the interior region 510 has a size (width) selected based on an amount of tensile stress expected to occur in the interior region 510 during field use of an overall device incorporating a flip chip die or package having the passivation layer 500 such as a smartphone or an IoT device. As with shear stress discussed above, the amount of tensile stress expected to occur may be assessed using computer modelling or by physically testing similar IC devices in a laboratory, or by using other known techniques and will may vary depending upon the characteristics of the passivation layer, the characteristics of adjacent layers, bumps, and interconnects, and the expected usage of the overall device, including expected temperature changes and any shocks expected to occur during routine use of the overall device (such as shocks occurring when a smartphone is accidentally dropped by its user).

In one illustrative example, the vias $502_2$, $502_3$, and $502_4$ within the interior region 510 have diameters (widths) in the range of 30 to 60 microns (or, e.g., more specifically 35-55 microns or, e.g., even more specifically 30-45 microns), which is larger than the sizes of the perimeter region vias $502_2$, as discussed above. As with sheer stress, in a particular flip chip implementation, the sizes of the vias within the interior region 510 may be optimized based on computer modelling to minimize the risk of tensile stress damage or, at least, via sizes may be determined to reduce the risk of the tensile stress failure. Again, numerous other design considerations and constraints also may be addressed in the design of the flip chip device. The via size that is optimal for mitigating tensile stress to avoid core damage may not be the overall optimal size when taking all factors into consideration.

Figure 6:
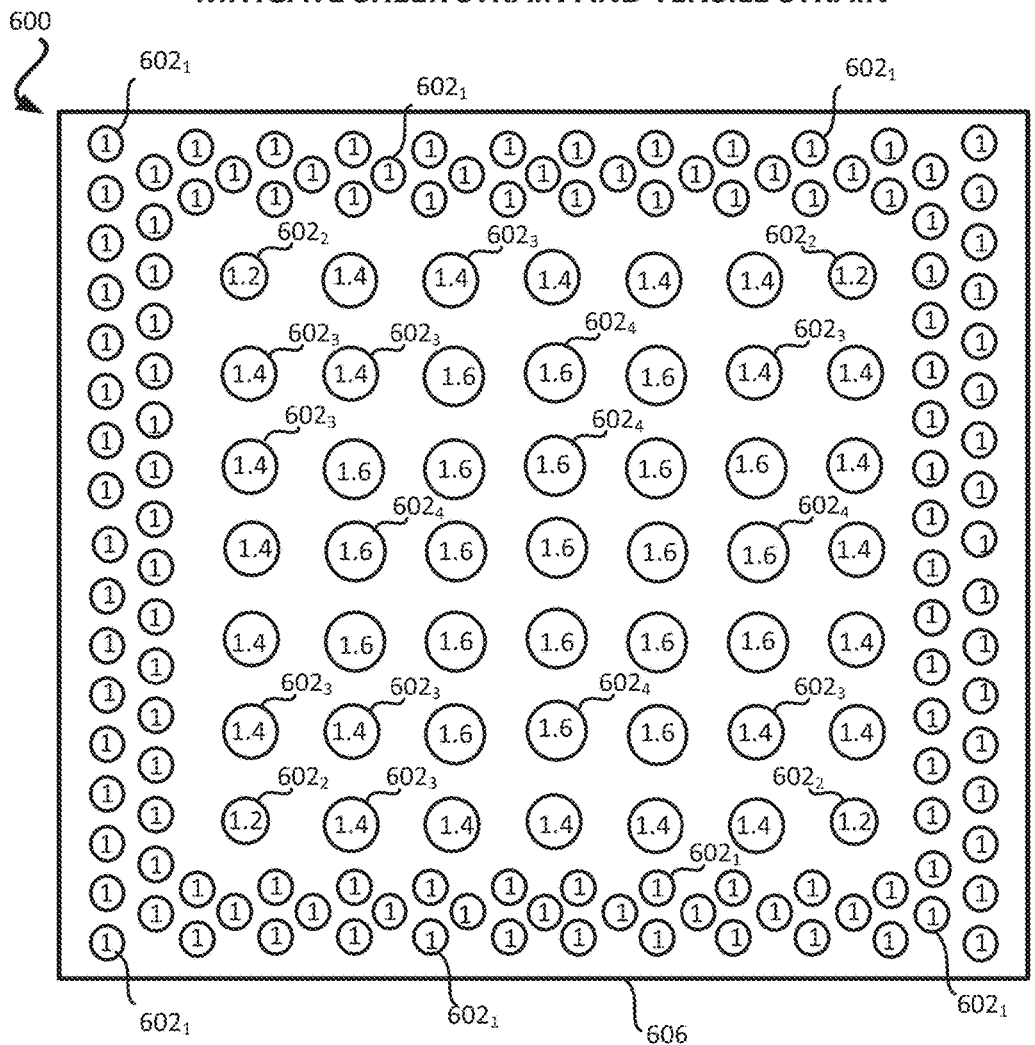
FIG. 6 is a planar view of the passivation layer of FIG. 5, wherein exemplary relative values of via size are illustrated to more clearly show the relative via sizes.

FIG. 6 illustrates the relative sizes of various vias 602 of a passivation layer 600 of an example, wherein vias $602_1$ formed near the perimeter 606 of the passivation layer 600 are assigned a relative size value of "1" and vias formed in an interior of the passivation layer 600 are assigned incrementally larger relative size values for comparison purposes. More specifically, vias $602_2$ have a relative size value of "1.2"; vias $602_3$ have a relative size value of "1.4"; and vias $602_4$ have a relative size value of "1.6." These relative numeral values are not intended to be actual size values (in microns) but are provided to more clearly illustrate that vias closer to the core of the passivation layer 600 may have incrementally larger sizes as compared to those closer to the perimeter. FIG. 6 is just one example of an arrangement of differently sized vias.

Figure 7:
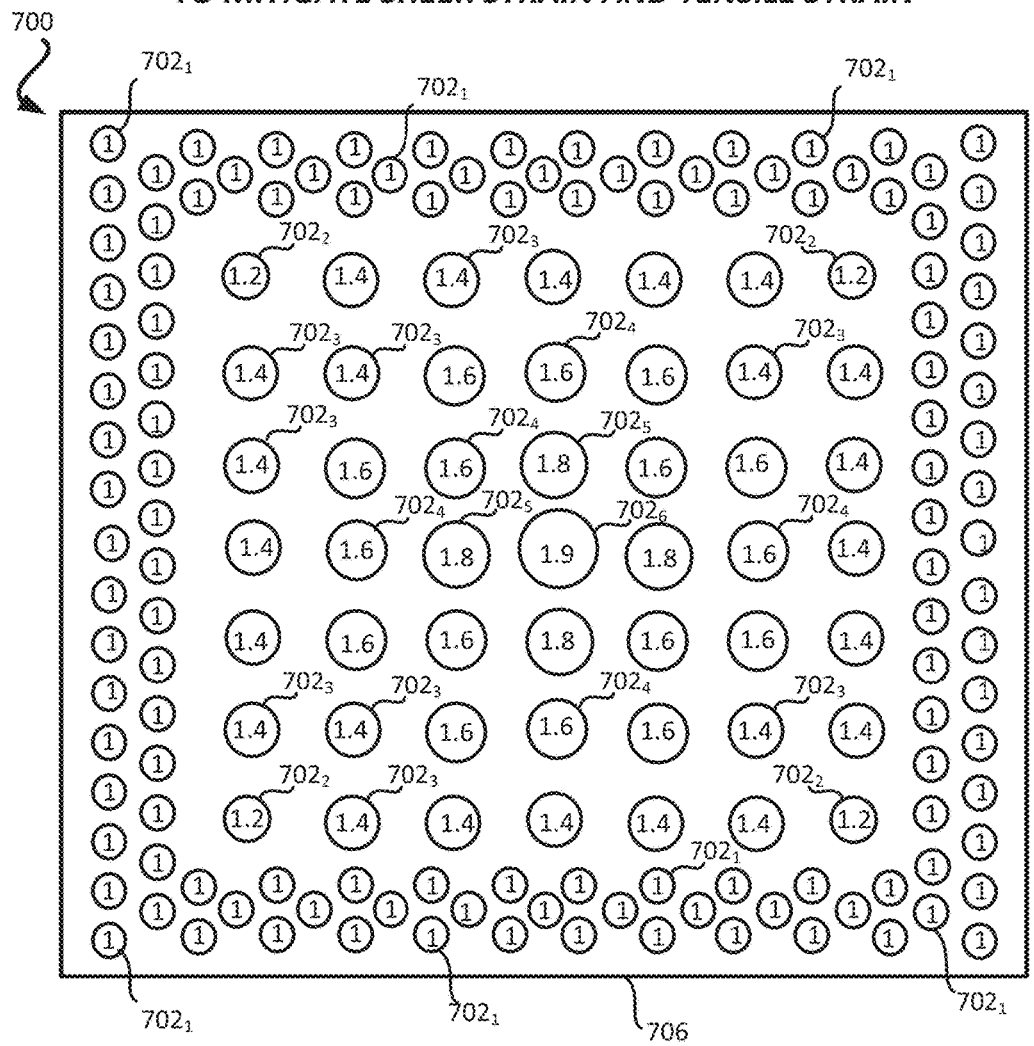
FIG. 7 is a planar view of an alternative passivation layer to that of FIG. 5 having even larger vias near the center or core of the passivation layer.

FIG. 7 illustrates the relative sizes of various vias 702 of an alternative passivation layer 700 of yet another example, wherein vias $702_1$ formed near the perimeter 706 of the passivation layer 700 are again assigned a relative size value of "1" and vias formed in an interior of the passivation layer 700 are assigned incrementally larger relative size values for comparison purposes. In this example, vias $702_2$ again have a relative size value of "1.2"; vias $702_3$ have a relative size value of "1.4"; and vias $702_4$ have a relative size value of "1.6." However, an additional set of vias $702_5$ closer to the center have a relative size value of "1.8" and a single via at the center of the passivation layer has a relative size value of "1.9." The relative numeral values are again not intended to be actual size values but are provided to illustrate an alternative biasing arrangement have still larger via sizes closer to the center.

Figure 8:
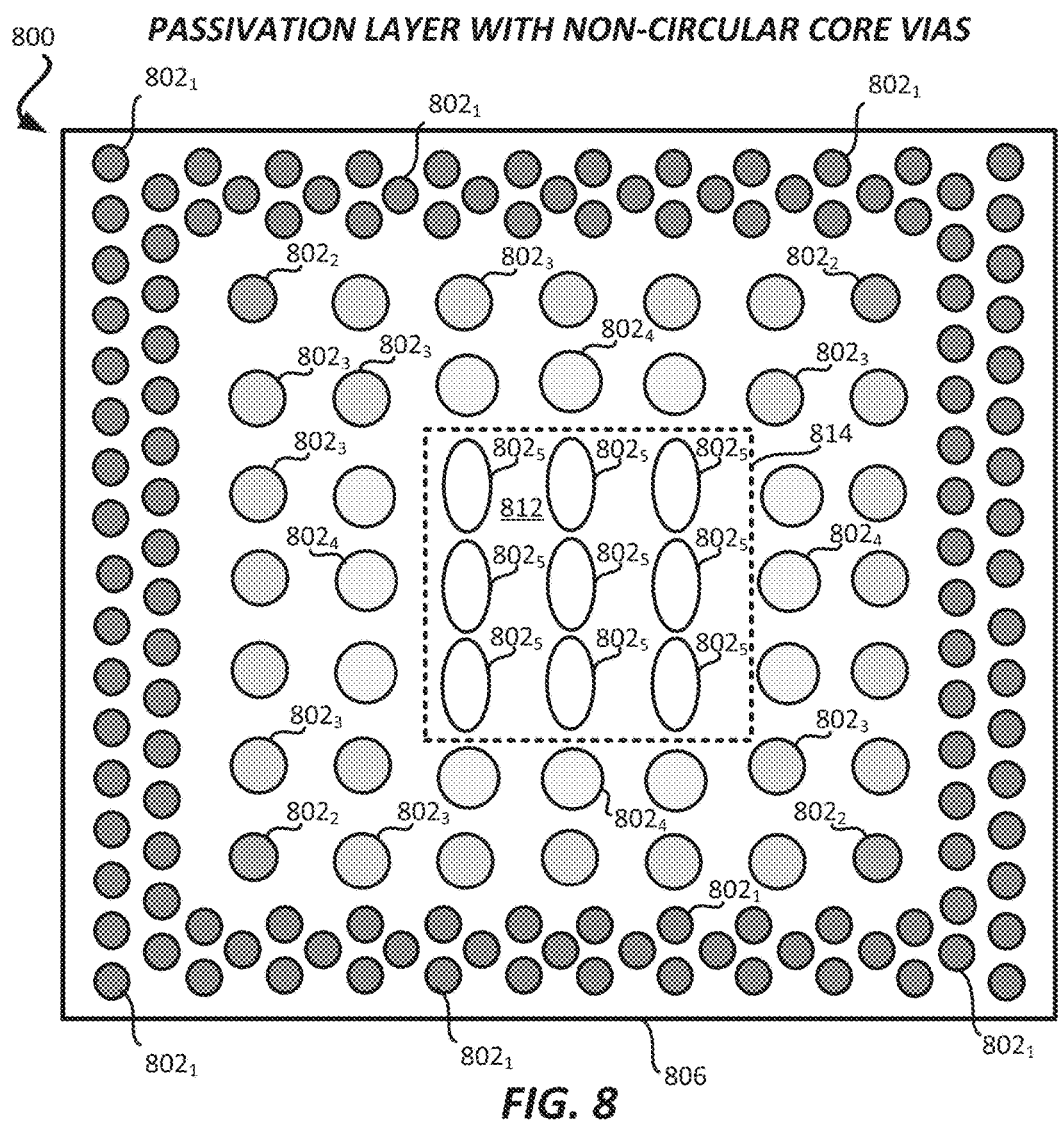
FIG. 8 is a planar view of another alternative passivation layer to that of FIG. 5 having some non-circular vias near the center or core of the passivation layer.

FIG. 8 illustrates a passivation layer example 800 whereby at least some of the vias in the core are not circular but have an oblong or oval shape. As with the preceding examples, a first set of perimeter region vias $802_1$ is formed in a perimeter region 806 of the passivation layer 800. Various sets of interior region vias $802_2$, $802_3$ and $802_4$ are formed in an interior region of the passivation layer 800 and, in this example, an innermost set of vias 802₅ is formed in a central or core region 812 (identified by dashed line 814). The vias 802₅ of core region 812 have an oblong, oval or elliptical shape and are generally larger than the various other vias, particularly the vias of the perimeter region. The figure thus illustrates that the vias need not be circular or round. Non-circular shapes may be warranted if the interconnects that pass through the passivation layer are not round. Non-circular shapes also may be useful if the tensile stress expected to occur at the core is not isotropic (e.g. the stress is biased in a particular direction).

Depending upon the particular tensile stress expected to occur, it thus may be appropriate to bias the shapes of vias (and not merely their sizes) to mitigate the risk of tensile stress damage. The amount of tensile stress expected to occur and its direction(s) may be assessed using computer modelling or other known techniques and the shapes of at least some of the vias may be optimized based on computer modelling to minimize the risk of tensile stress damage or, at least, via shapes may be determined to reduce the risk of tensile stress failure. As noted, other design considerations and constraints may be addressed in the design of a flip chip device. The via shape that is optimal for mitigating tensile stress to avoid core damage may not be the overall optimal shape when taking all factors into consideration. It is further noted that the size and shape of a via are just two via configuration parameters that may be set or biased to reduce a risk of damage to the passivation layer or adjacent layers due to tensile stress or other forms of stress (e.g. sheer stress). Other via parameters that might be configured or biased include, for example, the amount and type of any materials or techniques used to reinforce the vias or adjacent structures.

Figure 9:
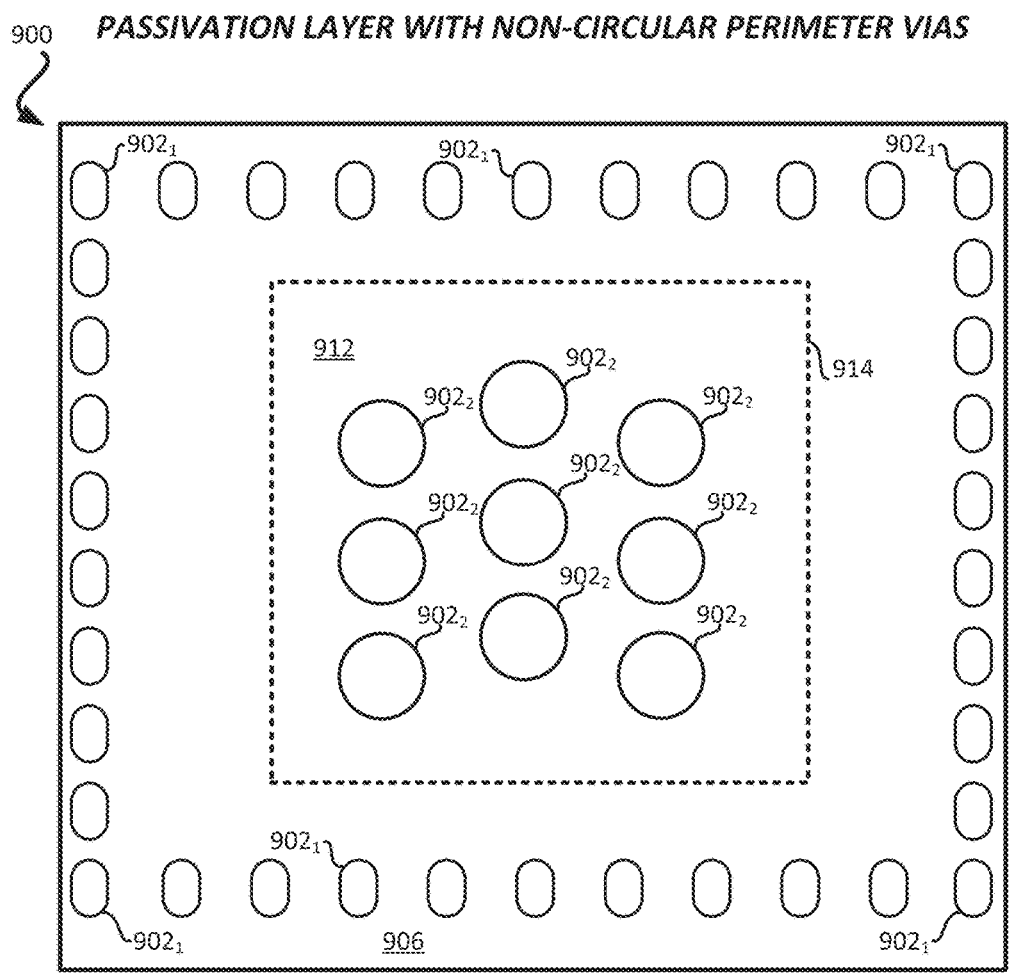
FIG. 9 is a planar view of yet another alternative passivation layer to that of FIG. 5 having some non-circular vias near the perimeter of the passivation layer.

FIG. 9 illustrates a passivation layer example 900 whereby at least some of the vias in the perimeter region are oblong or elliptical. As with the preceding examples, a first set of perimeter region vias 902₁ is formed in a perimeter region 906 of the passivation layer 900. A second set of vias 902₂ are formed in an interior or core region 912 (identified by dashed line 914) of the passivation layer 900. The vias 902₂ of core region 912 are substantially larger than the vias 902₁ of the perimeter region 906 and are round. The vias 902₁ of the perimeter region 906 are oblong and substantially smaller that the vias 902₂ of the core region 912. Non-circular via shapes may be warranted in the perimeter region if the interconnects that pass through the perimeter region of the passivation layer are not round. Non-circular shapes also may be useful if the sheer stress expected to occur in the perimeter region is not isotropic (e.g. the stress is biased in a particular direction).

FIG. 10 illustrates an exemplary perimeter region via 1000 and an exemplary core via 1002, along with exemplary sizes (where the shape of the vias is the cross-sectional shape of the via in a plane through the layer that the via is formed in). In the example of FIG. 10, the perimeter region via 1000 is 20 microns wide and 30 microns long, with straight edges. (The shape may be formed with two circles, each 20 microns in diameter, spaced apart by 10 micros with their outer perimeters connected or coupled as shown.) The core via 1002 in this example is 44 microns in diameter. These values are merely illustrative. For instance, in other examples, the core via might have a diameter in the range of 40 to 50 microns or in one of the still broader ranges noted above. The perimeter region via may have a length in the range of 15 to 28 microns and a length in the range of 28 to 35 microns. These values are also merely illustrative. For instance, in other examples, the perimeter region via might have length or width in one of the still broader ranges noted above.

FIGS. 11-13 illustrate exemplary ways or manners in which the sizes (widths) of vias may be increased from the perimeter to the center of a passivation layer (or decreased from the center toward the perimeter). Briefly, FIG. 11 is a graph 1110 illustrating a uniform linear decrease 1102 in via diameter from the center 1104 of a passivation layer to its perimeter 1106. FIG. 12 is a graph 1200 illustrating a non-linear decrease 1202 in via diameter from the center 1204 of a passivation layer to its perimeter 1206. FIG. 13 is a graph 1300 illustrating a step-wise incremental decrease 1302 in via diameter from the center 1304 of a passivation layer to its perimeter 1306 (of which FIG. 5 provides one example). The slope, shape and other characteristics of the variation curves and/or variation functions 1102, 1202 and 1302 of FIGS. 11-13 may be configured, biased or optimized though computer modelling to minimize or at least reduce an overall risk of damage to the passivation layer or adjacent layers due to tensile and sheer stress.

FIG. 14 illustrates a portion of a flip chip die or package 1400 for use in device where the flip chip has a passivation layer with vias biased to mitigate tensile stress and shear stress, as discussed above. Briefly, a first (or upper or top) IC device 1402 is coupled using bumps 1404 to a substrate 1406. In the example of FIG. 14, IC device 1402 has three layers 1410, 1412 and 1414, of which layer 1414 is a passivation layer (which made be a polymer). The layer 1410 may include an IC device layer. The layer 1412 may include one or more electrical connection layers. Vias 1415 (shown in phantom lines as the vias are internal to layer 1414) are formed within the passivation layer 1414 allow for electrical interconnection of circuit components within layer 1412 to another device or package using solder bumps 1404 via the substrate. Layer 1412 might be, e.g., a redistribution layer that allows for redistribution of circuitry from one layer to another. As shown and as described above, the passivation layer vias 1415 have sizes (widths) that increase from the perimeter toward the core or interior of the passivation layer. The size, shape or other parameters of the passivation layer vias 1415 may be configured to reduce or mitigate the risk of damage due to various stresses such as tensile stress (which often occurs during field use) and sheer stress (which often occurs during assembly).

FIG. 15 illustrates a portion of another exemplary flip chip die or package 1500 for use in device where the passivation layer with the biased vias is within the lower component of a stacked arrangement. Briefly, a first IC device 1502 is coupled using bumps 1504 to a second IC device 1506, which has a larger set of bumps 1508 for connecting or coupling to yet another device or package (not shown) such as a printed circuit board (PCB). In the example of FIG. 15, IC device 1506 has three layers 1510, 1512 and 1514, of which layer 1514 is a passivation layer. The layer 1510 may include an IC device layer. The layer 1512 may include one or more electrical connection layers. The layer 1512 may include a redistribution layer. Vias 1515 (shown in phantom lines) are formed within the passivation layer 1514 allow for electrical interconnection of circuit components within layer 1512 to another device or package using solder bumps 1508. Again, the passivation layer vias 1515 may have sizes that increase from the perimeter toward the core or interior of the passivation layer.

Having described various examples of passivation layers for use in flip chip dies or packages of IC devices, various processes and methods for fabricating an IC device that includes one or more passivation layers will now be described.

Exemplary Sequences and Components for Fabricating IC Device

In some implementations, providing/fabricating an IC device or package that includes a passivation layer of the type described above includes several processes.

FIG. 16 illustrates one exemplary sequence for providing/fabricating components of an IC device. In some implementations, the sequence of FIG. 16 may be used to fabricate a device such as that of FIG. 14, which may include a passivation layer such as shown in FIGS. 5-9 and/or other packages or devices described in the present disclosure. However, for the purpose of simplification, FIG. 16 will be described in the context of providing/fabricating a simplified IC device having a single IC device layer and a single varying diameter via layer. It should be noted that the sequence of FIG. 16 may combine one or more stages in order to simplify and/or clarify the sequence for providing a package or device. In some implementations, the order of the processes may be changed or modified. Some procedures may be performed concurrently.

Briefly, at 1605, an IC device layer is provided by a suitable IC fabrication device or machine. At 1610, a varying diameter via layer is formed over the IC device layer, wherein the varying diameter via layer has an interior region and a perimeter region. The varying diameter via layer may be, for example, a polymer passivation layer. At 1615, interior region vias are formed within the interior region, and, at 1620, perimeter region vias are formed within the perimeter region, wherein the interior region vias are larger than the perimeter region vias. At 1625, the IC device layer may be coupled to at least one other device through the vias of the varying diameter via layer (so as to form electrical connections or electrical couplings). In some implementations, several packages or devices are concurrently fabricated on a wafer, and a singulation process is performed to cut a wafer into individual packages or devices.

FIG. 17 further illustrates exemplary sequences for providing/fabricating components of an IC device where the varying diameter via layer is a passivation layer. Briefly, at 1705, an IC device designer or automated system determines or assesses an amount of tensile stress expected to occur in an interior region of a particular passivation layer of an IC device during subsequent usage of the completed IC device. At 1710, a set of first via sizes and/or shapes are selected by a suitable fabrication device or machine (or by IC device designers who program the fabrication device or machine) for any vias to be formed in the interior region of the IC device passivation layer, with the sizes and/or shaped selected based on the amount of tensile stress expected to occur in the interior region during subsequent use of the IC device. At 1715, the passivation layer is formed by a suitable fabrication device or machine on or over or adjacent to an IC device layer of the IC device while forming vias in the interior region of the passivation layer using the selected set of first via sizes and/or shapes to reduce a risk of damage to the IC device due to tensile stress or to otherwise strengthen the IC device against tensile stress.

FIG. 18 further illustrates still other exemplary sequences for providing/fabricating components of an IC device where the varying diameter via layer is a passivation layer. Briefly, at 1805, an IC device designer or automated system determines or assesses an amount of sheer stress expected to occur in a perimeter region of a particular passivation layer of an IC device during assembly or use of the IC device. At 1810, a set of second via sizes and/or shapes are selected by a suitable fabrication device or machine (or by IC device designers who program the fabrication device or machine) for any vias to be formed in the perimeter region of the IC device passivation layer, with the sizes and/or shaped selected based on the amount of sheer stress expected to occur in the perimeter region during assembly or use of the IC device. At 1815, the passivation layer is formed by a suitable fabrication device or machine over an IC device layer of the IC device while forming vias in the perimeter region of the passivation layer using the selected set of second via sizes and/or shapes to reduce a risk of damage to the IC device due to sheer stress or to otherwise strengthen the IC device against sheer stress. The procedure/sequence of FIG. 18 may be used in conjunction with the procedure/sequence of FIG. 16 to form vias in both the interior and perimeter regions of a particular passivation layer to address both sheer stress and tensile stress.

FIG. 19 illustrates another exemplary sequence for providing/fabricating an IC device, which includes additional details. At 1905, an integrated circuit (IC) device layer is provided by a suitable IC fabrication device or machine for use in a flip chip die or package. At 1910, a passivation layer (such as a polyimide layer or screen) is formed over the IC device layer by the IC fabrication device or machine, where the passivation layer is configured to provide physical, chemical or electrical insulation/isolation, stability and/or separation between IC layers or components, facilitate the formation of thin film transistors, or otherwise protect the IC device layer. At 1915, a first set or group of vias are configured by the IC fabrication device or machine to reduce a risk of damage to the IC device due to tensile stress by selecting first via sizes and shapes based on an amount of tensile stress expected to occur in an interior region of the passivation layer during subsequent use of the IC device, and forming the first set or group of vias in the interior region of the passivation layer using the first selected via shapes and sizes. At 1920, a second set or group of vias are configured by the IC fabrication device or machine to reduce a risk of damage to the IC device due to sheer stress by: selecting second via sizes and shapes based on an amount of sheer stress expected to occur in a perimeter region of the passivation layer during assembly of the IC device, where the second set of vias have sizes are smaller than the first set of vias; and forming the second set or group of vias in the perimeter region of the passivation layer using the second selected via shapes and sizes. At 1925, the IC device layer may be coupled to at least one other device through the vias of the passivation layer (so as to form electrical connections through the passivation layer). As noted, several packages or devices may be concurrently fabricated on a wafer, with a singulation process performed to cut a wafer into individual packages or devices.

FIG. 20 illustrates components of an exemplary system or apparatus 2000 for providing/fabricating an IC device, which may include one or more processor(s) 2002 for controlling an IC device fabrication machine 2004 that fabricates the IC device. In some implementations, the system 2000 may be used to fabricate a device such as that of FIG. 15, which may include a passivation layer such as shown in FIGS. 5-9 and/or other packages or devices described in the present disclosure. For the purpose of simplification, FIG. 20 will be described in the context of providing/fabricating a simplified IC device having a single IC device layer and a single passivation layer. Some components may be combined or split into sub-components.

Briefly, the processor 2002 of system 2000 includes a tensile stress determination controller 2005 operative to input, determine, ascertain or otherwise assess an amount of tensile stress expected to occur in the interior region of an IC device passivation layer during subsequent use of the IC device. The processor 2002 also includes an interior region via configuration controller 2010 operative to select or configure the sizes and/or shapes of vias of the interior region of the passivation layer to reduce a risk of damage to the IC device due to tensile stress. Still further, the processor 2002 includes a passivation layer formation controller 2015 operative to control the fabrication machine 2004 to form a passivation layer over an IC device layer of the IC device using the selected via sizes and/or shapes to reduce a risk of damage to the IC device due to tensile stress.

FIG. 21 illustrates further components of an exemplary system or apparatus 2100 for providing/fabricating an IC device, which may include one or more processor(s) 2102 for controlling a fabrication machine (such as fabrication machine 1804 of FIG. 18) that fabricates the IC device and which includes additional components for forming vias in the perimeter region of a passivation layer.

As with the system of FIG. 20, the processor 2102 of the system 2100 includes (a) a tensile stress determination controller 2105 operative to input, determine or otherwise assess an amount of tensile stress expected to occur in the interior region of an IC device passivation layer during subsequent use of the IC device, and (b) an interior region via configuration controller 2110 operative to select or configure the sizes and/or shapes of vias of the interior region of the passivation layer to reduce a risk of damage to the interior region of the passivation layer due to tensile stress. Additionally, the processor 2102 includes (a) a sheer stress determination controller 2115 operative to input, determine or otherwise assess an amount of sheer stress expected to occur in the perimeter region of the IC device passivation layer during assembly or use of the IC device, and (b) a perimeter region via configuration controller 2120 operative to select or configure the sizes and/or shapes of vias of the perimeter region of the passivation layer to reduce a risk of damage to the IC device due to sheer stress. Still further, the processor 2102 includes a passivation layer formation controller 2125 operative to control a fabrication machine (such as fabrication machine 2004 of FIG. 20) to form a passivation layer over an IC device layer of the IC device using the various selected via sizes and/or shapes to (a) reduce a risk of damage to the IC device due to tensile stress and (b) reduce a risk of damage to the IC device due to sheer stress.

FIG. 22 illustrates a machine-readable storage medium 2200 for controlling the fabrication of an IC device, the machine-readable storage medium having one or more instructions which when executed by at least one processing circuit causes the at least one processing circuit to: control a fabrication machine to form a varying diameter via layer on an IC device layer, wherein the varying diameter via layer has an interior region and a perimeter region; control the fabrication machine to form interior region vias within the interior region; and control the fabrication machine to form perimeter region vias within the perimeter region; wherein the interior region vias are formed larger than the perimeter region vias.

In the example of FIG. 22, the machine-readable storage medium 2200 includes instructions 2205 to control a tensile stress determination processor to input, determine or otherwise assess an amount of tensile stress expected to occur in the interior region of an IC device passivation layer during subsequent use of the IC device. The machine-readable storage medium 2200 also includes instructions 2210 to control a via configuration processor to select or configure the sizes and/or shapes of vias of the interior region of the passivation layer to reduce a risk of damage to the interior region of the passivation layer due to tensile stress. Still further, the machine-readable storage medium 2200 includes instructions 2215 to control a fabrication machine to form a passivation layer over an IC device layer and to form at least one via in an interior region of the passivation layer, wherein the at least one via is configured to reduce a risk of damage to the IC device due to tensile stress.

Additional or alternative instructions may be provided for performing other functions described herein or illustrated in the various figures. For example, instructions may be provided for selecting a first via size or shape based on an amount of tensile stress expected in the interior region during a subsequent use or usage of the IC device, and for controlling a fabrication machine to form the at least one via in the interior region with the selected first via size or shape. Instructions may be provided for controlling the fabrication machine to form at least one via in a perimeter region of the passivation layer, wherein the at least one via in a perimeter region is configured to reduce a risk of damage to the IC device due to sheer stress. Instructions may be provided for selecting a second via size or shape based on an amount of sheer stress expected in the perimeter region during assembly of the IC device, and for controlling the fabrication machine to form the at least one via in the perimeter region with the second via size or shape.

Still further, instructions may be provided for controlling the fabrication machine to form at least one via in the interior region with a larger size or shape than the at least one via formed in the perimeter region. Instructions may be provided for controlling the fabrication machine to form a plurality of vias in the interior region with sizes or shapes that differ from one another, including vias with sizes that increase toward a center of the passivation layer from a perimeter of the passivation layer, such as with a uniform or step-wise increase in via size.

Insofar as any control processors are concerned, such as processors 2002 and 2102 of FIGS. 20 and 21, an element, or any portion of an element, or any combination of elements of the processor may be implemented as a processing system that includes one or more processing circuits such as a system-on-a-chip (SoC). In addition to an SoC, examples of processing circuits include microprocessing circuits, microcontrollers, digital signal processing circuits (DSPs), field programmable gate arrays (FPGAs), programmable logic devices (PLDs), state machines, gated logic, discrete hardware circuits, and other suitable hardware configured to perform the various functionality described throughout this disclosure. That is, a processing circuit 1902, as utilized in system or apparatus 1900, may be used to implement any one or more of the processes described herein.

Although not shown in the figures, various buses may be used to link together various circuits including one or more processing circuits, storage devices, and machine-readable, processing circuit-readable or computer-readable media (such as the media of FIG. 22). The processing circuits may be responsible for managing any such buses and for managing general processing, including the execution of software stored on the machine-readable medium of FIG. 22. The software, when executed by a processing circuit, causes the processing system to perform the various functions described herein for any particular apparatus. The machine-readable medium of FIG. 22 may also be used for storing data that is manipulated by processing circuit 804 when executing software.

One or more processing circuits may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. A processing circuit may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory or storage contents. Information, arguments, parameters, data, etc. may be passed, forwarded, or transmitted via any suitable means including memory sharing, message passing, token passing, network transmission, etc.

The software may reside on machine-readable medium 2200. The machine-readable medium 2200 may be a non-transitory machine-readable medium. A non-transitory processing circuit-readable medium, processor-readable medium, machine-readable medium, or computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), RAM, ROM, a programmable ROM (PROM), an erasable PROM (EPROM), an electrically erasable PROM (EEPROM), a register, a removable disk, a hard disk, a CD-ROM and any other suitable medium for storing software and/or instructions that may be accessed and read by a computer. The terms "machine-readable medium", "computer-readable medium", "processing circuit-readable medium", and/or "processor-readable medium" may include, but are not limited to, non-transitory media such as portable or fixed storage devices, optical storage devices, and various other media capable of storing, containing or carrying instruction(s) and/or data.

Thus, the various methods described herein may be fully or partially implemented by instructions and/or data that may be stored in a "machine-readable medium," "computer-readable medium," "processing circuit-readable medium," and/or "processor-readable medium" and executed by one or more processing circuits, machines and/or devices. The machine-readable medium may also include, by way of example, a carrier wave, a transmission line, and any other suitable medium for transmitting software and/or instructions that may be accessed and read by a computer. The machine-readable medium 2200 may reside in a processing system such as system or apparatus 2000, external to the processing system, or distributed across multiple entities including multiple processing systems. The machine-readable medium 2200 may be embodied in a computer program product. By way of example, a computer program product may include a processing circuit-readable medium in packaging materials. Those skilled in the art will recognize how best to implement the described functionality presented throughout this disclosure depending on the particular application and the overall design constraints imposed on the overall system.

Additionally or alternatively, the structures, functions or operations of the various components or blocks of the figures described herein may be implemented as various means for performing the listed function. By way of example, an apparatus for facilitating electrical device interconnections within an IC device (such as flip chip 1400 of FIG. 14) may be provided that includes: means for facilitating electrical device interconnections to an IC device layer through an interior region of a second layer (such as the interior region vias $902_2$ of FIG. 9 of the passivation layer 900); and means for facilitating electrical device interconnections to the IC device layer through a perimeter region of the second layer (such as the perimeter region vias $902_1$ of FIG. 9); wherein the means for facilitating electrical device interconnections through the interior region (e.g. vias $902_2$) includes vias that are larger than vias within the means for facilitating electrical device interconnections through the perimeter region of the second layer (e.g. vias $902_1$). In other example, the apparatus may include: means for passivation of the IC device layer (where the means for passivation may be, e.g., passivation layer 1514 of FIG. 15 or passivation layer 900 of FIG. 9); and means for facilitating device interconnections through an interior or core region (such as region 912 of FIG. 9) of the means for passivation of the IC device layer (where the means for facilitating device interconnections may be, e.g., the vias $902_1$-$902_2$ of FIG. 8), with the means for facilitating device interconnections through the interior region configured to reduce a risk of damage to the IC device due to tensile stress (such as with the relatively large configuration of the vias $902_2$ of FIG. 9).

Still further, the means for facilitating device interconnections (e.g. the vias $902_1$-$902_2$ of FIG. 9) through the interior region of the passivation layer may include at least one via with a size or shape configured or selected based on an amount of tensile stress expected in the interior region during a subsequent use of the IC device (such as, once again, vias $902_2$ of FIG. 9, which have relatively large oblong shapes). Means may also be provided for facilitating device interconnections through a perimeter region (906) of the means for passivation of the IC device layer (where the means for facilitating device interconnections through the perimeter region may be, for example, the vias $902_1$ of FIG. 9), and where the means for facilitating device interconnections through the perimeter region is configured to reduce a risk of damage to the IC device due to sheer stress (such as the relatively small and oblong shapes of the vias $902_1$ of FIG. 9).

In some examples, the means for facilitating device interconnections through the perimeter region includes at least one via (such as vias $902_1$ of FIG. 9) with a size or shape configured or selected based on an amount of shear stress expected in the perimeter region during a subsequent assembly of the IC device. In some examples, the at least one via in the interior or core region (such as vias $902_2$ of FIG. 9) is larger than the at least one via in the perimeter region (such as vias $902_1$ of FIG. 9). In some examples, a plurality of vias are formed in the interior region with sizes or shapes differing from one another (such as the vias $702_2$-$702_6$ of FIG. 7). The plurality of vias formed in the interior region may have sizes that increase toward a center of the means for passivation of from a perimeter of the means for passivation (such as the vias $702_2$-$702_6$ of FIG. 7). See, also, the increase in via size from perimeter to center as illustrated in FIG. 11. The plurality of vias in the interior region may have sizes that increase uniformly toward the center of the means for passivation from the perimeter of the means for passivation (as shown in FIG. 11). Alternatively, the plurality of vias in the interior region may have sizes that increase step-wise toward the center of the means for passivation from the perimeter of the means for passivation (as illustrated in FIG. 13).

Additional Exemplary Sequences and Components for Fabricating IC Device

FIG. 23 illustrates one exemplary sequence for providing/fabricating an IC device. In some implementations, the sequence of FIG. 23 may be used to fabricate a device such as that of FIG. 15, which may include a passivation layer such as shown in FIGS. 5-9 and/or other packages or devices described in the present disclosure. However, for the purpose of simplification, FIG. 23 will be described in the context of providing/fabricating a simplified IC device having a single IC device layer and a single passivation layer. It should be noted that the sequence of FIG. 23 may combine one or more stages in order to simplify and/or clarify the sequence for providing a package or device. In some implementations, the order of the processes may be changed or modified. Some procedures may be performed concurrently. Briefly, at 2305, an IC device layer is provided. At 2310, a passivation layer is formed over the IC device layer, where the passivation layer has at least one via formed in an interior region of the passivation layer that is configured to reduce a risk of damage to the IC device due to tensile stress. Optionally, at 2315, the IC device layer is coupled to at least one other device through the vias of the passivation layer (so as to form electrical connections through the passivation layer). In some implementations, several packages or devices are concurrently fabricated on a wafer, and a singulation process is performed to cut a wafer into individual packages or devices.

FIG. 24 illustrates another exemplary sequence for providing/fabricating an IC device, which includes additional details. Again, in some implementations, the sequence may be used to fabricate a device such as that of FIG. 15, which may include a passivation layer such as shown in FIGS. 5-9 and/or other packages or devices described in the present disclosure. For the purpose of simplification, FIG. 24 will be described in the context of providing/fabricating a simplified IC device having a single IC device layer and a single passivation layer. The sequence of FIG. 24 may combine one or more stages in order to simplify and/or clarify the sequence for providing a package or device. In some implementations, the order of the processes may be changed or modified. Some procedures may be performed concurrently. Briefly, at 2405, an IC device layer is provided for use in a flip chip die or package. At 2410, a passivation layer (such as a polyimide layer or screen) is formed over the IC device layer and configured to protect the IC device layer. At 2415, the first group of vias is formed in an interior region of the passivation layer and includes vias configured to reduce a risk of damage to the IC device due to tensile stress. The vias are configured with sizes selected based on an amount of tensile stress expected to occur in the interior region during use of the IC device. At 2420, a second group of vias is formed in a perimeter region of the passivation layer and includes vias configured to reduce a risk of damage to the IC device due to sheer stress. The vias in the perimeter region are configured with sizes selected based on an amount of sheer stress expected to occur in the perimeter region during assembly of the IC device or package and have sizes smaller than the vias formed in the interior of the passivation layer. Optionally, at 2425, the IC device layer is coupled to at least one other device through the vias of the passivation layer (so as to form electrical connections through the passivation layer). As noted, several packages or devices may be concurrently fabricated on a wafer, with a singulation process performed to cut a wafer into individual packages or devices.

FIG. 25 illustrates an alternative exemplary sequence for providing/fabricating an IC device. In some implementations, the sequence may be used to fabricate a device such as that of FIG. 15, which may include a passivation layer such as shown in FIGS. 5-9 and/or other packages or devices described in the present disclosure. For the purpose of simplification, FIG. 25 will be described in the context of providing/fabricating a simplified IC device having a single IC device layer and a single passivation layer. The sequence of FIG. 25 may combine one or more stages in order to simplify and/or clarify the sequence for providing a package or device. In some implementations, the order of the processes may be changed or modified. Some procedures may be performed concurrently. Briefly, at 2505, an integrated circuit (IC) device layer is provided for use in a flip chip die or package. At 2510, a passivation layer is formed over the IC device layer. At 2515, a plurality of passivation vias are formed within the passivation layer, wherein a first group or set of the passivation vias are formed in a perimeter region of the passivation layer and have a first size and a second group or set of the passivation vias are formed within an interior region of the passivation layer and have a second, different size. Optionally, at 2520, the IC device layer is coupled to at least one other device through the vias of the passivation layer (so as to form electrical connections through the passivation layer). As already discussed, several packages or devices may be concurrently fabricated on a wafer, then a singulation process is performed to cut a wafer into individual packages or devices.

FIG. 26 illustrates an exemplary sequence for designing/fabricating/assembling an IC device. In some implementations, the sequence may be used to design and fabricate a device such as that of FIG. 15, which may include a passivation layer such as shown in FIGS. 5-9 and/or other packages or devices described in the present disclosure. For the purpose of simplification, FIG. 26 will be described in the context of designing/fabricating/assembling a simplified IC device having a single passivation layer. The sequence of FIG. 26 may combine one or more stages in order to simplify and/or clarify the sequence for completing the package or device. In some implementations, the order of the processes may be changed or modified. Some procedures may be performed concurrently. Briefly, at 2605, an IC device is designed to include a flip chip die or package having a passivation layer. At 2610, a degree or amount of sheer stress expected within the passivation layer during assembly of the IC device is determined or otherwise ascertained or obtained (by, for example, using computer modelling techniques as discussed above). At 2615, a degree or amount of tensile stress expected within the passivation layer during subsequent use of the IC device with a smartphone or other device is determined or otherwise ascertained or obtained (by, for example, again using computer modelling techniques). At 2620, configuration parameters are determined or otherwise ascertained or obtained for configuring a first group of vias (to be formed in a perimeter region of the passivation layer) to reduce or minimize a risk of damage to the IC device due to sheer stress. At 2625, configuration parameters are determined or otherwise ascertained or obtained for configuring a second group of vias (to be formed in an interior region of the passivation layer) to reduce or minimize a risk of damage to the IC device due to tensile stress. At 2630, the IC device is fabricated and assembled while including a passivation layer formed to have the first and second groups of vias configured using the configuration parameters determined at 2620 and 2625 (i.e. the parameters suitable for reducing or minimizing risk of damage). As noted, several packages or devices may be concurrently fabricated on a wafer, then a singulation process is performed to cut a wafer into individual packages or devices. Note also that, herein, the terms "obtain" or "obtaining" broadly cover, e.g., calculating, computing, generating, acquiring, receiving, retrieving, inputting or performing any other suitable corresponding actions.

Although primarily described with respect to flip chip dies and packages, aspects of the techniques described herein are applicable to other types of devices or packages or other methods for fabricating or assembling such devices or packages.

Exemplary Electronic Devices

FIG. 27 illustrates various electronic devices that may be integrated with any of the aforementioned integrated device, semiconductor device, integrated circuit, die, interposer, package or PoP. For example, a mobile phone device 2702, a laptop computer device 2704, a fixed location terminal device 2706, a wearable device 2708 may include an integrated device 2700 as described herein. The integrated device 2700 may be, for example, any of the integrated circuits, dies, integrated devices, integrated device packages, integrated circuit devices, device packages, integrated circuit (IC) packages, package-on-package devices described herein. The devices 2702, 2704, 2706, 2708 illustrated in FIG. 27 are merely exemplary. Other electronic devices may also feature the integrated device 2700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 5, 6, 7, 8, 9, 10, 11, 12, 13, 14, 15, 16, 17, 18, 19, 20, 21, 22, 23, 24, 25, 26 and/or 27 may be rearranged and/or combined into a single component, process, feature or function or embodied in several components, processes, or functions. Additional elements, components, processes, and/or functions may also be added without departing from the disclosure. It should also be noted that FIGS. 5, 6, 7, 8, 9, 10, 11, 12, 13, 14, 15, 16, 17, 18, 19, 20, 21, 22, 23, 24, 25, 26 and/or 27 and its corresponding description(s) in the present disclosure is not limited to dies and/or ICs. In some implementations, FIGS. 5, 6, 7, 8, 9, 10, 11, 12, 13, 14, 15, 16, 17, 18, 19, 20, 21, 22, 23, 24, 25, 26 and/or 27 and its corresponding description may be used to manufacture, create, provide, and/or produce integrated devices. In some implementations, a device may include a die, an integrated device, a die package, an IC, a device package, an IC package, a wafer, a semiconductor device, a PoP device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated circuit (IC) device comprising:
   an IC device layer; and
   at least one electrical connection layer located over the IC device layer; and
   a varying diameter via layer located over the at least one electrical connection layer, the varying diameter via layer comprising (i) an interior region having a plurality of interior region vias and (ii) a perimeter region having a plurality of perimeter region vias,
      wherein the plurality of interior region vias of the interior region is larger than the plurality of perimeter region vias of the perimeter region, and
      wherein the varying diameter via layer comprises an interior surface that is coupled to an interior surface of the at least one electrical connection layer.

2. The IC device of claim 1, wherein the varying diameter via layer is part of a redistribution layer of the IC device.

3. The IC device of claim 1, further comprising a passivation layer laterally surrounding the plurality of interior region vias and the plurality of perimeter region vias, wherein the varying diameter via layer is part of the passivation layer via.

4. The IC device of claim 1, further comprising a first plurality of bumps coupled to the plurality of interior region vias.

5. The IC device of claim 4, further comprising a second plurality of bumps coupled to the plurality of perimeter region vias.

6. The IC device of claim 5, wherein the first plurality of bumps is larger than the second plurality of bumps.

7. The IC device of claim 1, wherein a size of at least one of the interior region vias is configured to reduce a risk of tensile stress damage to the IC device.

8. The IC device of claim 1, wherein a size of at least one of the perimeter region vias is configured to reduce a risk of sheer stress damage to the IC device.

9. The IC device of claim 1, wherein at least one interior region via has a size or shape configured based on an amount of tensile stress.

10. The IC device of claim 1, wherein at least one perimeter region via has a size or shape configured based on an amount of sheer stress.

11. The IC device of claim 1, wherein each of the plurality of interior region vias has a width and the widths of the plurality of interior region vias increase toward a center of the varying diameter via layer.

12. The IC device of claim 11, wherein the widths of the plurality of interior region vias increases step-wise toward the center of the varying diameter via layer.

13. The IC device of claim 1, wherein the IC device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

14. A method for fabricating an integrated circuit (IC) device, comprising:
providing an IC device layer;
forming at least one electrical connection layer over the IC device layer; and
forming a varying diameter via layer over the at least one electrical connection layer, the varying diameter via layer comprising (i) an interior region having a plurality of interior region vias and (ii) a perimeter region having a plurality of perimeter region vias,
wherein the plurality of interior region vias of the interior region is larger than the plurality of perimeter region vias of the perimeter region, and
wherein the varying diameter via layer comprises an interior surface that is coupled to an interior surface of the at least one electrical connection layer.

15. The method of claim 14, wherein the varying diameter via layer is part of a redistribution layer of the IC device.

16. The method of claim 14, further comprising forming a passivation layer that laterally surrounds the plurality of interior region vias and the plurality of perimeter region vias, wherein the varying diameter via layer is part of the passivation layer via.

17. The method of claim 14, further comprising coupling a first plurality of bumps to the plurality of interior region vias.

18. The method of claim 17, further comprising coupling a second plurality of bumps to the plurality of perimeter region vias.

19. The method of claim 18, wherein the first plurality of bumps is larger than the second plurality of bumps.

20. The method of claim 18, wherein each of the plurality of interior region vias has a width and the widths of the plurality of interior region vias increase toward a center of the varying diameter via layer.

* * * * *